United States Patent
Mizukami et al.

(10) Patent No.: US 9,385,298 B2
(45) Date of Patent: Jul. 5, 2016

(54) ELECTROMECHANICAL CONVERSION ELEMENT, LIQUID DROP DISCHARGE HEAD AND IMAGE FORMING APPARATUS

(71) Applicants: Satoshi Mizukami, Kanagawa (JP); Takahiko Kuroda, Hyogo (JP); Masahiro Ishimori, Tokyo (JP)

(72) Inventors: Satoshi Mizukami, Kanagawa (JP); Takahiko Kuroda, Hyogo (JP); Masahiro Ishimori, Tokyo (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/867,350

(22) Filed: Sep. 28, 2015

(65) Prior Publication Data
US 2016/0099402 A1 Apr. 7, 2016

(30) Foreign Application Priority Data

Oct. 1, 2014 (JP) ................................ 2014-203311
Oct. 1, 2014 (JP) ................................ 2014-203399

(51) Int. Cl.
| | |
|---|---|
| B41J 2/045 | (2006.01) |
| H01L 41/08 | (2006.01) |
| H01L 41/18 | (2006.01) |
| B41J 2/14 | (2006.01) |
| H01L 41/083 | (2006.01) |

(52) U.S. Cl.
CPC .......... H01L 41/0805 (2013.01); B41J 2/14233 (2013.01); H01L 41/18 (2013.01); B41J 2/14201 (2013.01); B41J 2/14274 (2013.01); H01L 41/08 (2013.01); H01L 41/083 (2013.01); H01L 41/0831 (2013.01)

(58) Field of Classification Search
None
See application file for complete search history.

(56) References Cited

U.S. PATENT DOCUMENTS

| | | | |
|---|---|---|---|
| 7,562,968 B2 | 7/2009 | Sumi et al. | |
| 7,717,546 B2 | 5/2010 | Noguchi et al. | |
| 7,804,231 B2 | 9/2010 | Ifuku et al. | |
| 8,678,563 B2 | 3/2014 | Itayama | |
| 9,022,530 B2 | 5/2015 | Ohashi | |
| 2011/0215679 A1 | 9/2011 | Naono | |
| 2011/0316393 A1* | 12/2011 | Naono | H01L 41/0805 310/367 |
| 2013/0250010 A1 | 9/2013 | Sakai | |
| 2015/0022592 A1 | 1/2015 | Aoyama et al. | |

FOREIGN PATENT DOCUMENTS

| | | | |
|---|---|---|---|
| JP | 2008-028030 | 2/2008 | |
| JP | 2008-192868 | 8/2008 | |
| JP | 2011-181828 | 9/2011 | |
| JP | EP 2363901 A2 * | 9/2011 | ........... B41J 2/14233 |
| JP | 2012-124233 | 6/2012 | |
| JP | 4984018 | 7/2012 | |
| JP | 5041765 | 10/2012 | |
| JP | 2012-253161 | 12/2012 | |
| JP | 2013-118232 | 6/2013 | |
| JP | 2013-197552 | 9/2013 | |
| JP | 5299676 | 9/2013 | |
| JP | 2015-023053 | 2/2015 | |

* cited by examiner

*Primary Examiner* — Lisa M Solomon
(74) *Attorney, Agent, or Firm* — Cooper & Dunham LLP

(57) ABSTRACT

An electromechanical conversion element includes a lower electrode formed directly or indirectly on a substrate or a base film; an electromechanical conversion film formed on the lower electrode and including a piezoelectric body having a perovskite crystal structure preferentially oriented with a {n00} plane where n is a positive integer; and an upper electrode formed on the electromechanical conversion film. A diffraction peak at a position 2θ at which a diffraction intensity has a maximum value and which corresponds to a (X00) plane or a (00X) plane, X being 1 or 2, obtained by θ-2θ measurement in X-ray diffraction measurement, shows a trapezoidal peak shape and has two or more bending points.

10 Claims, 13 Drawing Sheets

ELECTROMECHANICAL CONVERSION ELEMENT, LIQUID DROP DISCHARGE HEAD AND IMAGE FORMING APPARATUS

BACKGROUND OF THE INVENTION

1. Field of the Invention

The disclosures herein generally relate to an electromechanical conversion element, a liquid drip discharge head and an image forming apparatus. Especially, the present invention relates to an electromechanical conversion element including an electromechanical conversion film formed of a piezoelectric body, a liquid drip discharge head provided with the electromechanical conversion element and an image forming apparatus provided with the liquid drop discharge head.

2. Description of the Related Art

Conventionally, liquid drop discharge apparatuses, each having a liquid drop discharge head that discharges a liquid drop of ink which is liquid for forming an image, as image forming apparatuses such as printers, facsimile machines or copy machines, have been known. The above-described liquid drop discharge head includes a nozzle for discharging liquid drops, a liquid chamber communicating with the nozzle, and a pressure generation unit that generates a pressure to be applied to liquid in the liquid chamber. As the pressure generation unit, for example, a unit in which on a vibration plate serving as a part of a wall surface of the liquid chamber, a piezoelectric type electromechanical conversion element having an electromechanical conversion film formed of a piezoelectric body is provided, has been known. According to deformation of the electromechanical conversion element by applying an electric voltage, a surface of the vibration plate on the side of the liquid chamber, on which the electromechanical conversion element is provided, is displaced, and thereby a pressure to be applied to liquid in the liquid chamber can be generated.

As the above-described electromechanical conversion element, a configuration in which a lower electrode, an electromechanical conversion film, an upper electrode and the like are laminated has been known. As a material of the above-described electromechanical conversion film, a material having a perovskite crystal structure, such as lead zirconate titanate (PZT), has been generally used. The electromechanical conversion film having the perovskite crystal structure is a ferromagnetic material having a spontaneous polarization property. In the ferromagnetic material, in the case where a direction of a spontaneous polarization axis is caused to coincide with a direction of an electric field, a strain displacement extending in the direction of the spontaneous polarization axis (strain displacement by the piezoelectric effect) can be obtained.

Japanese Published Patent Application No. 2008-192868 describes that in the electromechanical conversion film having the perovskite crystal structure, the strain displacement according to a piezoelectric effect of the above-described electromechanical conversion element can be made greater by making a crystal orientation of a (100) plane higher (a crystal orientation rate is greater than or equal to 80%), aligning directions of the spontaneous polarization axes and forming an electric field in the above-described direction. Moreover, Japanese Published Patent Application No. 2008-192868 describes that in the electromechanical conversion film, the strain displacement of the above-described electromechanical conversion element can be made further greater by rotating a polarization domain and using an effect of the rotation of the domain. The polarization domain refers to a region where the directions of the spontaneous polarization axes are aligned in the electromechanical conversion film.

Furthermore, it is experimentally known that in order to increase the above-described strain displacement it is effective to make a shape of a peak of diffraction intensity asymmetric, which is obtained from a plane parallel to a plane preferentially oriented according to a measurement by θ-2θ method in the electromechanical conversion film having the above-described perovskite crystal structure. Meanwhile, the peak of the diffraction intensity refers to a convex part of a diffraction intensity curve obtained by measurement.

However, it is found that in the electromechanical conversion film having the above-described perovskite crystal structure, even if the shape of the peak of the diffraction intensity obtained from the plane parallel to the plane preferentially oriented according to the measurement by the θ-2θ method is made to be an asymmetric shape, the strain displacement cannot be made sufficiently great.

In the above-described electromechanical conversion film having the perovskite crystal structure, a measurement by the rocking curve method along with the θ-2θ method is often used in order to evaluate a crystal orientation. The inventors of the present application have found that at a position where diffraction intensity becomes the maximum in the measurement by the θ-2θ method, a shape of a peak of the diffraction intensity obtained by the measurement by the rocking curve method becomes an important criterion for increasing stress displacement.

Furthermore, in the analysis of a crystal structure of the above-described electromechanical conversion film having the perovskite crystal structure, in order to evaluate how much a crystal plane is tilted with respect to a substrate plane, a measurement of changing a tilt angle is performed in a peak of diffraction intensity at a position where the diffraction intensity becomes the maximum (2θ). The inventors of the present application have found that a shape of the peak of the diffraction intensity obtained by the measurement of changing the tilt angle ($\chi$) becomes an important criterion for increasing the stress displacement.

SUMMARY OF THE INVENTION

It is a general object of at least one embodiment of the present invention to provide an electromechanical conversion element, a liquid drip discharge head and an image forming apparatus that substantially obviate one or more problems caused by the limitations and disadvantages of the related art.

In one embodiment, an electromechanical conversion element includes a lower electrode formed directly or indirectly on a substrate or a base film; an electromechanical conversion film formed on the lower electrode and including a piezoelectric body having a perovskite crystal structure preferentially oriented with a {n00} plane where n is a positive integer; and an upper electrode formed on the electromechanical conversion film. A diffraction peak at a position 2θ at which diffraction intensity has a maximum value and which corresponds to a (X00) plane or a (00X) plane, X being 1 or 2, obtained by θ-2θ measurement in X-ray diffraction measurement, shows a trapezoidal peak shape and has two or more bending points.

In another embodiment, a liquid drop discharge head includes a nozzle configured to discharge liquid drops; a pressure chamber in communication with the nozzle; and a discharge drive unit configured to control a pressure of liquid in the pressure chamber. A part of a wall surface of the pressure liquid chamber includes a vibration plate, and an electromechanical conversion element is arranged in the vibration plate. An electromechanical conversion element includes a lower electrode formed directly or indirectly on a substrate or a base film; an electromechanical conversion film formed on the lower electrode and including a piezoelectric body having a perovskite crystal structure preferentially oriented with a {n00} plane where n is a positive integer; and an upper electrode formed on the electromechanical conversion film. A diffraction peak at a position 2θ at which diffraction intensity has a maximum value and which corresponds to a (X00) plane or a (00X) plane, X being 1 or 2, obtained by θ-2θ measurement in X-ray diffraction measurement, shows a trapezoidal peak shape and has two or more bending points.

In yet another embodiment, an image forming apparatus includes a liquid drop discharge head which includes a nozzle configured to discharge liquid drops; a pressure chamber in communication with the nozzle; and a discharge drive unit configured to control a pressure of liquid in the pressure chamber. A part of a wall surface of the pressure liquid chamber includes a vibration plate, and an electromechanical conversion element is arranged in the vibration plate. The electromechanical conversion element includes a lower electrode formed directly or indirectly on a substrate or a base film; an electromechanical conversion film formed on the lower electrode and including a piezoelectric body having a perovskite crystal structure preferentially oriented with a {n00} plane where n is a positive integer; and an upper electrode formed on the electromechanical conversion film. A diffraction peak at a position 2θ at which diffraction intensity has a maximum value and which corresponds to a (X00) plane or a (00X) plane, X being 1 or 2, obtained by θ-2θ measurement in X-ray diffraction measurement, shows a trapezoidal peak shape and has two or more bending points.

According to the embodiment of the present application, a sufficient stress displacement can be obtained by an electromechanical conversion film having the perovskite type crystal structure.

BRIEF DESCRIPTION OF THE DRAWINGS

Other objects and further features of embodiments will become apparent from the following detailed description when read in conjunction with the accompanying drawings, in which.

DESCRIPTION OF THE PREFERRED EMBODIMENTS

Figure 1:
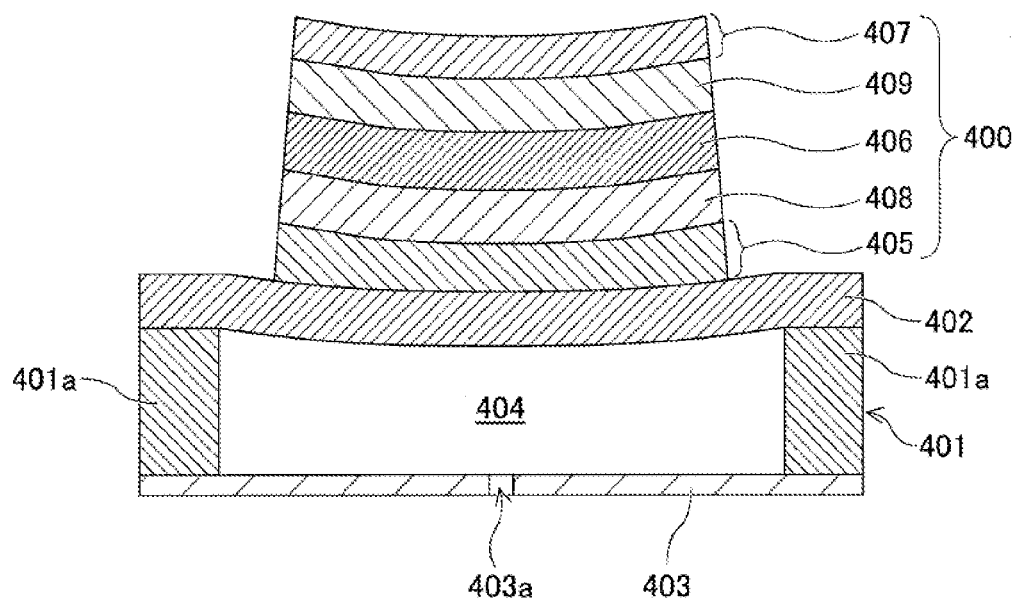
FIG. 1 is a cross-sectional diagram illustrating an example of a schematic configuration of a liquid drop discharge head according to a present embodiment.

In the following, embodiments of the present invention will be described with reference to the accompanying drawings.

In the following, embodiments of the present invention applied to an electromechanical conversion element which is a component of a liquid drop discharge head used in an ink jet recording apparatus as an image formation apparatus (a liquid drop discharge apparatus) will be explained.

Meanwhile, in the following explanation, {hkl} plane expresses a plane representing a (hkl) plane and plural crystal planes equivalent to the (hkl) plane according to symmetry in which a direction of a spontaneous polarization in a crystal of a piezoelectric body is not taken into account. Moreover, the {hkl} plane may be any one crystal plane of the (hkl) plane and the plural crystal planes equivalent to the (hkl) plane, or may be plural crystal planes selected from the (hkl) plane and the plural crystal planes equivalent to the (hkl) planes. For example, in the above-described electromechanical conversion film having the perovskite crystal structure, a {100} plane expresses any one or more of plural crystal planes including a (100) plane and five other crystal planes equivalent to the (100) plane. Moreover, in the description of the present invention, a "peak of diffraction intensity" indicates a convex part of a diffraction intensity curve obtained by measurement of an X-ray diffraction, and does not indicate the maximum value of the diffraction intensity.

An ink jet recording apparatus has a lot of advantages, such as low noise, high-speed printing, degree of freedom for ink which is liquid for forming an image, or inexpensive regular paper. Then, the ink jet recording apparatuses are widely developed as image forming apparatuses such as printers, facsimile machines or copying machines.

A liquid drop discharge head used in an ink jet recording apparatus includes a nozzle for discharging liquid drops (ink drops) for forming an image, a pressure liquid chamber in communication with the nozzle and pressure generation means of generating pressure for discharging ink in the pressure liquid chamber. The pressure generation means according to the present embodiment is a piezo type pressure generation means including a vibration plate composing a part of a wall surface of the pressure liquid chamber and an electromechanical conversion element having an electromechanical conversion film, which is a thin film, including a piezoelectric body for deforming the vibration plate. This electromechanical conversion element deforms itself in a case where a predetermined electric voltage is applied, displaces a surface of the vibration plate with respect to the pressure liquid chamber, and thereby generates pressure on the liquid in the pressure liquid chamber. According to this pressure, liquid drops (ink drops) can be discharged from the nozzle in communication with the pressure liquid chamber.

The piezoelectric body of the above-described electromechanical conversion film is a material which has a piezoelectric characteristic of deformation by an application of an electric voltage. For such a piezoelectric body, in the present embodiment, lead zirconate titanate (PZT: $Pb(Zr_x, Ti_{1-x})O_3$), which is a ternary metal oxide having the perovskite crystal structure, is used. A vibration mode upon applying drive voltage to the electromechanical conversion element having this electromechanical conversion film including this PZT includes plural kinds of vibration mode, as described above. For example, it includes a longitudinal vibration mode (push mode) associated with a deformation in a direction of film thickness by the piezoelectric constant d33, or a transverse vibration mode (bend mode) associated with a flexure deformation by the piezoelectric constant d31. Furthermore, it also includes a shear mode using a shear deformation of the film or the like.

The electromechanical conversion element having the above-described PZT film, as described later, can be fabricated on a Si substrate along with the pressure liquid chamber using the technique of a semiconductor process or MEMS (Micro Electro Mechanical System). Then, the electromechanical conversion element can be formed as a piezoelectric actuator, which is a thin film, for generating a pressure in the pressure liquid chamber.

Next, an example of a configuration the liquid drop discharge head provided with the piezoelectric actuator 400 as the electromechanical conversion element according to the present embodiment will be explained.

FIG. 1 is a cross-sectional diagram schematically illustrating an example of a configuration of the liquid drop discharge head according to the present embodiment. The liquid drop discharge head according to the present embodiment includes a substrate 401, a vibration plate 402, a nozzle plate 403, a pressure liquid chamber 404 (pressure chamber), a first electrode 405 as a lower electrode, a PZT film 406 as an electromechanical conversion film, a second electrode 407 as an upper electrode and the like. The pressure liquid chamber 404 is formed so as to be surrounded by a diaphragm part 401a, the vibration plate 402 and the nozzle plate 403, and communicates with a nozzle 403a of the nozzle plate 403.

For a material of the substrate 401, a silicon single-crystal substrate is preferably used. It is normally preferable to have a thickness greater than or equal to 100 μm but less than or equal to 600 μm. The surface of the substrate 401 includes three kinds of planes, i.e. a {100} plane, a {110} plane and a {111} plane. In the semiconductor industry, the {100} plane and the {111} plane are widely used in general. In the present embodiment, a single-crystal substrate having a surface which is mainly the {100} plane is mainly used.

In a case of preparing the pressure liquid chamber 404, as shown in FIG. 1, a silicon single-crystal substrate is processed by using etching. For the etching method in this case, anisotropic etching is generally used. The anisotropic etching uses the property that etching rates for plural kinds of planes of a crystal structure are different from each other. For example, in the anisotropic etching of immersing in alkali solution such as KOH, etching rate for the {111} plane is about 1/400 of that for the {100} plane. Therefore, it is known that for the plane a structure having a slope of about 54° can be prepared, and for the {110} plane a deep groove can be formed, and thereby the density of arrays can be made higher while maintaining stiffness. In the present embodiment, a single-crystal substrate having a surface of the {110} plane can also be used. However, in this case, a mask material of $SiO_2$ is also etched, and it is necessary to pay attention to this property.

The vibration plate 402 preferably has predetermined strength, since receiving a force generated by the PZT film 406, the vibration plate 402 is deformed and displaces the surface, and thereby generates pressure for liquid in the pressure liquid chamber 404 to discharge liquid drops from the nozzle 403a. A material of the vibration plate 402 includes a material prepared by a CVD (Chemical Vapor Deposition) method from Si, $SiO_2$ and $Si_3N_4$.

Furthermore, for the material of the vibration plate 402, a material having a linear expansion coefficient which is close to that of the first electrode 405 and the PZT film 406 is preferably selected. Especially, PZT is generally used for the material of the PZT film 406. Then, the material of the vibration plate 402 preferably has a linear expansion coefficient close to $8 \times 10^{-6}$ 1/K, i.e. greater than or equal to $5 \times 10^{-6}$ 1/K but less than or equal to $10 \times 10^{-6}$ 1/K. Furthermore, the material of the vibration plate 402 more preferably has a linear expansion coefficient greater than or equal to $7 \times 10^{-6}$ 1/K but less than or equal to $9 \times 10^{-6}$ 1/K.

The material of the vibration plate 402 is specifically aluminum oxide, zirconium oxide, iridium oxide, ruthenium oxide, tantalum oxide, hafnium oxide, osmium oxide, rhenium oxide, rhodium oxide, palladium oxide, a compound thereof, or the like. The above-described materials can be prepared at a spin coater by sputtering method or sol-gel method. A film thickness is preferably greater than or equal to 0.1 μm but less than or equal to 10 μm, and is more preferably greater than or equal to 0.5 μm but less than or equal to 3 μm. In a case of being less than this range, fabrication of the pressure liquid chamber becomes difficult, in a case of being greater than this range, a base is not easy to be deformed or displaced, and discharge of ink drops becomes unstable.

Moreover, the vibration plate 402 is preferably formed by laminating plural films having tensile stress or compression stress by LP (Low Pressure) CVD. The reason is as follows. In a case of the vibration plate 402 of single layer film, the material includes, for example, an SOI wafer. In this case, the wafer is quite costly, and in a case of aligning bending stiffness, it is impossible to set an arbitrary film stress. On the other hand, in the case of vibration plate 402 of laminated layers, by optimizing a configuration of the laminated layers, a degree of freedom of setting the stiffness and the film stress of the vibration plate 402 to desired values can be achieved. Therefore, controlling overall stiffness and stress of the vibration plate 402 can be realized by a combination of laminating layers and film thickness and configuration of laminated layers.

Accordingly, it is possible to timely respond to a material and film thickness of an electrode layer and a ferroelectric layer included in a piezoelectric actuator (piezoelectric element). Then, since the vibration plate 402, which has small fluctuation of stiffness and stress with respect to calcination temperature for the piezoelectric actuator (piezoelectric element) and is stable, can be obtained, a liquid drop discharge head, which has high-precision characteristic for discharging liquid drops and is stable, can be realized.

The first electrode 403 as a lower electrode is a layer of a metal material. For the metal material, conventionally, platinum (Pt) having high heat-resistance and low reactivity has been used. However, since platinum may not have sufficient barrier properties against lead, the metal material also includes platinum group elements such as iridium, platinum-rhodium, or an alloy film thereof. In a case of using platinum (Pt), since adhesion to a base (especially, $SiO_2$) is not sufficient, Ti, $TiO_2$, Ta, $Ta_2O_5$, $Ta_3N_5$ or the like is preferably laminated previously. The first electrode 405 is prepared by vacuum film formation such as spattering method or vacuum deposition, in general. Film thickness of the first electrode 405 is preferably greater than or equal to 0.02 μm but less than or equal to 0.1 μm, and more preferably greater than or equal to 0.05 μm but less than or equal to 0.1 Moreover, out of concern of temporal fatigue property for deformation of the PZT film 406, a first oxide layer 408 including conductive oxide such as strontium ruthenate is preferably laminated between the first electrode 405 and the PZT film 406.

The first oxide layer 408 affects an orientation of the PZT film 406 prepared thereon. Then, the material of the first oxide layer 408 is required to be appropriately selected depending on a plane direction of the PZT film 406 desired to be preferentially oriented. In the present embodiment, in order to be preferentially oriented to a {100} plane of the PZT film 406, for the material of the first oxide layer 408, $LaNiO_3$, $TiO_2$, lead titanate ($PbTiO_3$) or the like is selected. Film thickness of the first oxide layer 408 is preferably greater than or equal to 20 nm but less than or equal to 80 nm, and is more preferably greater than or equal to 30 nm but less than or equal to 50 nm. In a case of being thinner than this range, a sufficient property cannot be obtained in initial displacement or displacement degradation. Moreover, in a case of being greater than this range, dielectric strength voltage of the PZT film 406 which will be formed afterwards becomes worse, and leakage may occur easily.

For the second electrode 407 as an upper electrode, a metal material such as platinum (Pt) may be used in the same way as the above-described first electrode 405, and a second oxide layer 409 may be provided between a platinum layer and the PZT film 406 in order to ensure adhesion. The second oxide layer 409 is, for example, formed by laminating conductive oxide such as strontium ruthenate.

The PZT film 406 is a piezoelectric body having a perovskite crystal structure, and is a solid solution of lead zirconate ($PbZrO_3$) and $PbTiO_3$ having a characteristic which varies according to a ratio thereof. Composition providing a generally excellent piezoelectric property is a ratio of 53:47 for $PbZrO_3$ and $PbTiO_3$, shown in chemical formula as $Pb(Zr_{0.53}Ti_{0.47})O_3$, or generally shown by PZT(53/47). Complex oxide other than the PZT includes barium titanate or the like. In this case, barium titanate precursor solution can be prepared by dissolving with common solvent barium alkoxide and titanium alkoxide compound as starting materials.

These materials are described with general expression $ABO_3$, and complex oxide with main components of A=Pb, Ba, Sr, B=Ti, Zr, Sn, Ni, Zn, Mg, Nb concerned. There specific descriptions are $(Pb_{1-x}, Ba_x)(Zr, Ti)O_3$, $(Pb)(Zr_x, Ti_y, Nb_{1-x-y})O_3$, which is a case where Pb at site A is partially replaced by Ba, and Zr and Ti at site B are partially replaced by Nb. Such replacement is possible for dyad, and is performed in material reformulation toward an application of deformation property (displacement property) of the PZT. The effect thereof shows an action of decreasing property degradation due to evaporation of lead during heat treatment. It can be prepared at a spin coater by a sputtering method or sol-gel method. In this case, since patterning is required, a desired pattern is obtained by photolithoetching or the like.

In a case of preparing the PZT film 406 by a sol-gel method, by using, for example, lead acetate, zirconium alkoxide, and titanium alkoxide compound as starting materials, dissolving with methoxyethanol as common solvent and obtaining a homogeneous solution, a PZT precursor solution can be prepared. Since metal alkoxide compound is easily hydrolyzed by atmospheric moisture, to the precursor solution appropriate quantities of acetylacetone, acetic acid diethanolamine or the like as stabilizer may be added. In a case of obtaining PZT film on a whole surface of a base substrate, it is obtained by forming a coated film by a solution coating method such as spin coat, and by performing respective heat treatments such as solvent drying, thermal decomposition and crystallization. Since transformation from a coated film to a crystallized film is accompanied by volume contraction, in order to obtain a crack-free film, a concentration of the precursor is required to be controlled so that a film thickness less than or equal to 100 nm is obtained in one process.

The film thickness of the PZT film 406 is preferably greater than or equal to 0.5 μm but less than or equal to 5 μm, and is more preferably greater than or equal to 1 μm but less than or equal to 2 μm. In a case where the film thickness of the PZT film is less than the above-described preferable range, fabrication of the pressure liquid chamber 404, as shown in FIG. 1, becomes difficult. Moreover, in a case where the film thickness of the PZT film is greater than the above-described preferable range, the vibration plate 402 as the base is not easy to be deformed or displaced and discharge of ink drops becomes unstable, and in addition it becomes impossible to generate sufficient displacement. Moreover, in the case where the film thickness of the PZT film is greater than the above-described preferable range, in order to laminate several layers, a number of processes increases and a process time becomes longer.

A shape of a unit cell of a crystal of the PZT employing the perovskite structure of $ABO_3$ type varies according to a ratio of Ti and Zr which are atoms entering the site B. As the ratio of Ti increases, the crystal lattice of the PZT becomes tetragonal, and as the ratio of Zr increases, the crystal lattice of the PZT becomes rhombohedral. Moreover, in a case of adjusting composition ratio between Zr and Ti, at a peak of diffraction intensity corresponding to a {200} plane of the PZT film 406, among peaks of diffraction intensity obtained by measurement by θ-2θ method of X-ray diffraction, a position where the diffraction intensity becomes the maximum (2θ) varies.

The θ-2θ method is one of measurement methods often used as X-ray diffraction. In the θ-2θ method, X-ray waves are injected at an angle of θ with respect to a substrate plane of sample to be measured, X-ray waves reflected at an angle 2θ with respect to the direction of the injected X-ray are detected among X-ray waves reflected at the sample, and a change in diffraction intensity upon changing θ is investigated. In the diffraction by X-ray, diffraction intensity becomes higher in a case where the Bragg condition (2d sin θ=nλ (λ: wavelength of X-ray, d: crystalline plane separation and n: integer)) is satisfied. At this time, the crystalline plane separation (lattice constant) and the above-described 2θ have a corresponding relation. Therefore, based on a value of 2θ where the diffraction intensity becomes higher, a crystal structure of the sample to which X-rays are injected can be grasped.

Figure 2:
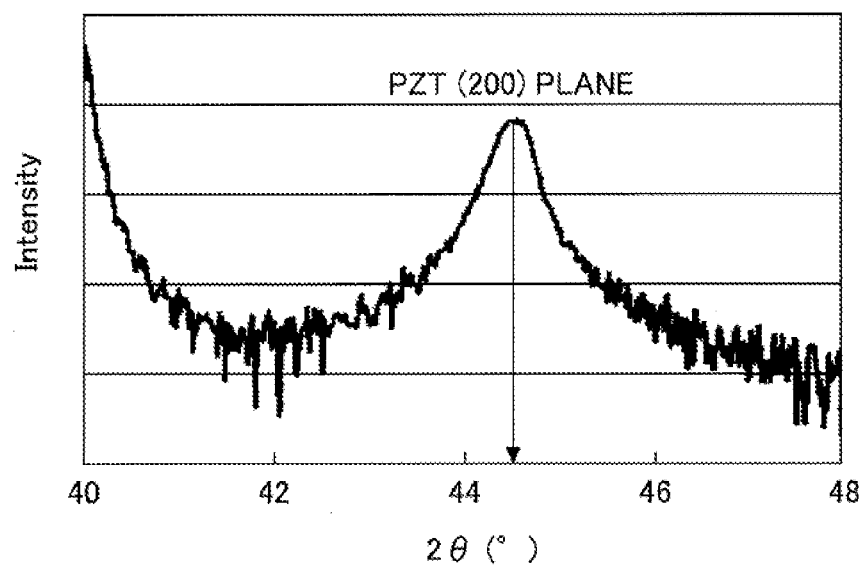
FIG. 2 is a diagram illustrating an example of a peak of diffraction intensity on a {200} plane obtained by a measurement by θ-2θ method of X-ray diffraction for a PZT film preferentially oriented with a {100} plane according to the present embodiment.

FIG. 2 is a graph illustrating an example of a peak of the diffraction index corresponding to a {200} plane of the PZT film 406 among peaks of the diffraction intensity obtained by measurement by θ-2θ method of X-ray diffraction. In a case of performing a digging process for a back side of the substrate 401 by etching or the like, in a state where there is not a constrained object in a dug portion, a range of 2θ is preferably greater than or equal to 44.45° but less than or equal to 44.75°. For the PZT film 406, in a case of being preferentially oriented to a {100} plane, in order to cause 2θ to fall within the above-described range, a composition ratio of Zr and Ti expressed by Ti/(Zr+Ti) is preferably greater than or equal to 0.45 but less than or equal to 0.55. Moreover, the composition ratio of Zr and Ti is more preferably greater than or equal to 0.48 but less than or equal to 0.52.

In a case where the composition ratio of Zr and Ti is less than the above-described lower limit (0.45), since an effect of domain rotation, which will be described later, becomes insufficient, strain displacement of the electromechanical conversion element cannot be ensured sufficiently. Moreover, in a case where the composition ratio of Zr and Ti is greater than the above-described upper limit (0.55), since a piezoelectric effect becomes insufficient, the strain displacement of the electromechanical conversion element also cannot be ensured sufficiently.

Figure 3A:
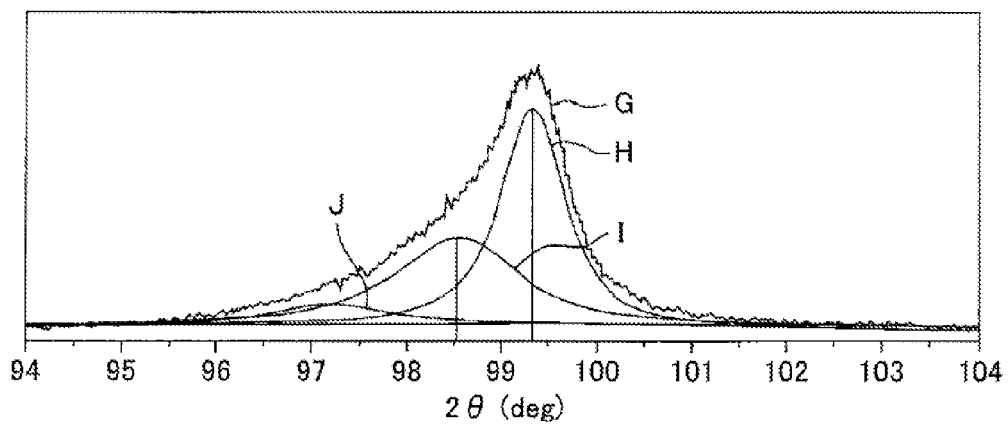
FIGS. 3A and 3B are graphs for explaining an extent of asymmetry of a shape of the peak of diffraction intensity obtained by the measurement by θ-2θ method of X-ray diffraction for the PZT film preferentially oriented with a {100} plane according to the present embodiment.
Figure 3B:
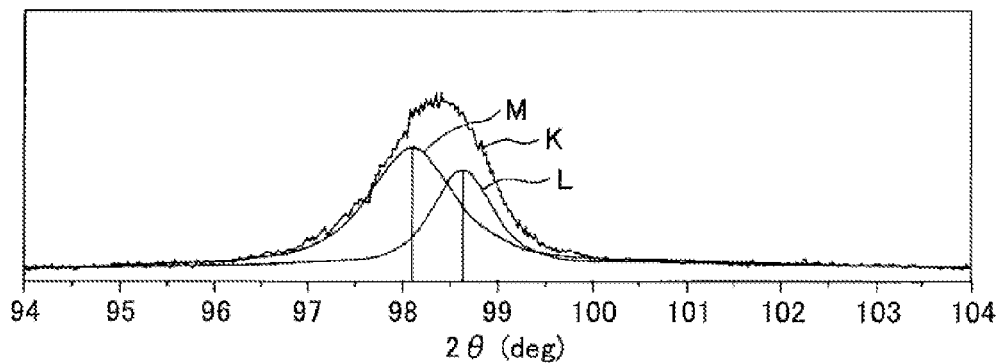

Moreover, according to the composition ratio of Zr and Ti, for the shape of the peak of the diffraction intensity obtained by the measurement by q-2q method of X-ray diffraction, asymmetry becomes greater or smaller. FIGS. 3A and 3B are graphs for explaining an extent of asymmetry of the shape of the peak of diffraction intensity obtained by the measurement by the θ-2θ method of X-ray diffraction for the PZT film preferentially oriented with a {100} plane.

FIG. 3A illustrates an example in a case where asymmetry of the shape of the peak of the diffraction intensity (G in the figure) is great. In this case, the crystal structure of the PZT film belongs to three structures, i.e. a tetragonal a-axis domain structure, a c-axis domain structure, and any one of structures of rhombohedral, orthorhombic and quasi-cubic. The peak of diffraction intensity shown by G in the figure is a combination of the tetragonal a-axis domain structure shown by H in the figure, the tetragonal c-axis domain structure shown by J in the figure and any one of the rhombohedral, orthorhombic and quasi-cubic structures shown by I in the figure. Reason why a position of the peak of the diffraction intensity of the tetragonal a-axis domain structure is greatly separated from a position of the peak of the diffraction intensity of the tetragonal c-axis domain structure is that a difference between lengths of the a-axis and c-axis is great. Moreover, reason why the maximum value of the peak of the diffraction intensity of the tetragonal c-axis domain structure is smaller than the maximum value of the peak of the diffraction intensity of the tetragonal a-axis domain structure is that ratio of the tetragonal a-axis domain structure is great in the film thickness direction of the PZT film.

On the other hand, FIG. 3B illustrates an example in a case where asymmetry of the shape of the peak of the diffraction intensity (K in the figure) is small. In this case, the crystal structure of the PZT film belongs to two structures, i.e. the tetragonal a-axis domain structure and the c-axis domain structure. The peak of diffraction intensity shown by K in the figure is a combination of the tetragonal a-axis domain structure shown by L in the figure and the tetragonal c-axis domain structure shown by M in the figure. The reason why a position of the peak of the diffraction intensity of the tetragonal a-axis domain structure is close to a position of the peak of the diffraction intensity of the tetragonal c-axis domain structure is that a difference between the lengths of the a-axis and c-axis is small. Moreover, the reason why the maximum value of the peak of the diffraction intensity of the tetragonal a-axis domain structure is almost the same as the maximum value of the peak of the diffraction intensity of the tetragonal c-axis domain structure is that the ratio of the tetragonal a-axis domain structure and the ratio of the tetragonal c-axis domain structure are almost the same in the film thickness direction of the PZT film.

Figure 4A:
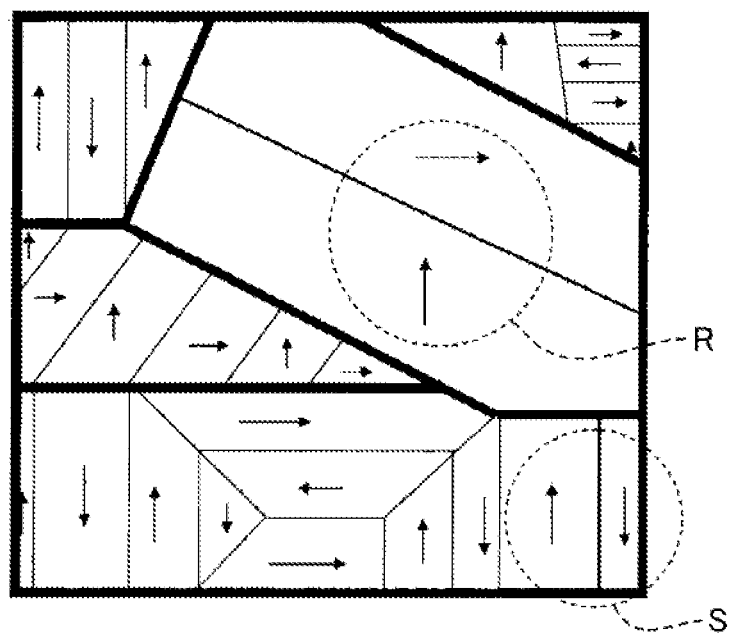
FIGS. 4A and 4B are diagrams for explaining a rotation of a domain by 90° according to the present embodiment.
Figure 4B:
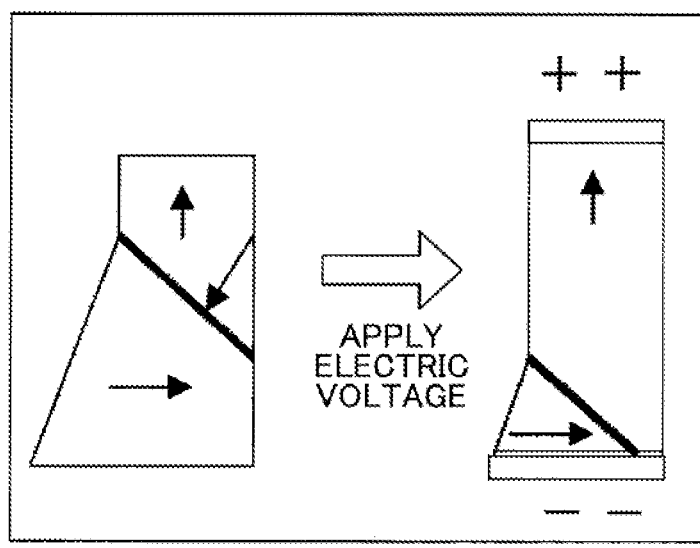

FIGS. 4A and 4B are diagrams schematically illustrating an example of the crystal structure of the PZT film. Arrows in the figures indicate directions of polarizations. As shown in FIG. 4A, an actual crystal includes regions having polarizations of different directions. In a drawing, in a case where an electric field is formed in a vertical direction, a region in which a polarization direction is the vertical direction in the drawing is a tetragonal a-axis domain, and a region in which a polarization direction is a horizontal direction in the drawing is a tetragonal c-axis domain. Meanwhile, in the tetragonal structure, lengths of the a-axis and b-axis are the same and only a length of the c-axis is different from others. In the tetragonal structure, since the a-axis direction and the b-axis direction are equivalent, a domain including intrinsic polarizations of a [100] direction, a [010] direction, and their opposite directions is referred to as an "a-axis domain", and a domain including intrinsic polarizations of a [001] direction and its opposite direction is referred to as a "c-axis domain".

A boundary between domains is referred to as a "domain wall". The domain wall includes a 180° domain wall having a boundary where c-axis domains are separated by a domain wall, and a 90° domain wall having a boundary where a-axis domain and c-axis domain are separated by a domain wall. In FIG. 4A, a region indicated by dashed curve S in the drawing is a 180° domain wall structure. Moreover, in the drawing, a region indicated by dashed curve R is a 90° domain wall structure. In the region of the 180° domain wall structure, in a case where an electric voltage is applied to form an electric field, a direction of polarization of the a-axis domain is reversed (180° domain rotation).

FIG. 4B is an enlarged diagram of the region indicated by the dashed curve R in FIG. 4A. In the region of the 90° domain wall structure, a phenomenon that in a case where an electric field is formed in the a-axis direction for the tetragonal c-axis domain, a polarization direction of the c-axis domain changes to the a-axis direction, and the domain direction rotates by 90° (90° domain rotation) Occurs. Since the c-axis domain rotates by 90° to become a-axis domain, the domain wall which is a boundary between the a-axis domain and the c-axis domain moves.

The 90° domain rotation from the c-axis direction to the a-axis direction does not occur in a region which is not the 90° domain wall structure where the c-axis domain is in contact with the a-axis domain. That is, in a region where c-axis domains are in contact with each other, even if an electric field is formed in the a-axis direction, the 90° domain rotation does not occur. This is because in a case of applying an electric voltage to form an electric field, at first a strain occurs in the a-axis domain by a piezoelectric effect, and this strain is transferred to the adjacent c-axis domain via the 90° domain wall, and thereby the polarization direction of the c-axis domain rotates to the electric field formation direction.

Compared with the strain by the piezoelectric effect, a strain by an anti-180° domain rotation such as the 90° domain rotation becomes great. That is, if it is possible to cause the anti-180° domain rotation to occur effectively at an electromechanical conversion element, a strain displacement of the electromechanical conversion element can be improved. Meanwhile, in the specification of the present application, in a case of simply referring to an "effect of domain rotation", it indicates the effect of the anti-180° domain rotation.

It is known that in a case of using a PZT film in which asymmetry of the shape of the peak of the diffraction intensity is great, as shown in FIG. 3A, compared with the case of using a PZT film in which asymmetry is small, as shown in FIG. 3B, a strain displacement of the electromechanical conversion element becomes great. It is considered that this is because by mixing different crystal structures of tetragonal and rhombohedral with each other, a density of anti-180° domain wall can be increased, thereby it is possible to cause the anti-180° domain rotation to occur effectively.

The θ-2θ method is used for determining how intervals of crystal planes distribute in a film thickness direction at a certain point on a substrate surface of a film to be measured. Then, at a point moved infinitesimally from the certain point on the above-described substrate surface in a horizontal direction of the substrate surface, it is impossible to determine how intervals of crystal planes distribute in the film thickness direction. In order to determine this, further measurement by a rocking curve method is necessary. Meanwhile, the rocking curve method is a method of measuring diffraction intensity while fixing an incident angle of X-ray waves and an angle of detector (2θ) at positions obtained by measurement by the θ-2θ method where diffraction intensity is the maximum, and infinitesimally changing only an angle (ω) between the sample substrate surface and incident X-ray around θ.

Figure 5A:
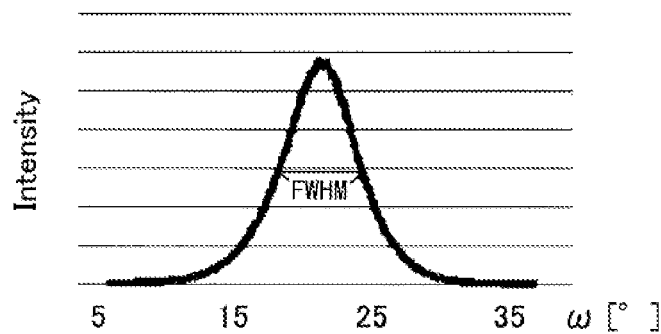
FIGS. 5A to 5C are diagrams illustrating examples of diffraction intensity curves obtained by measurement by a rocking curve method on a {200} plane for the PZT film preferentially oriented with a plane according to the present embodiment.
Figure 5B:
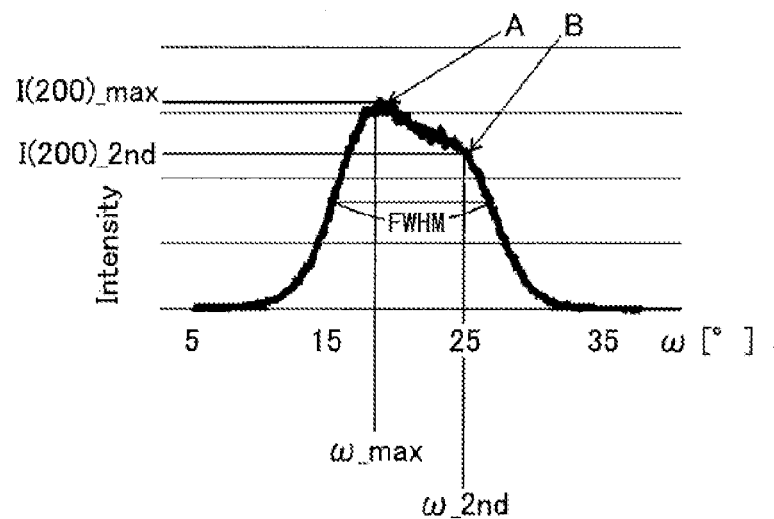
Figure 5C:
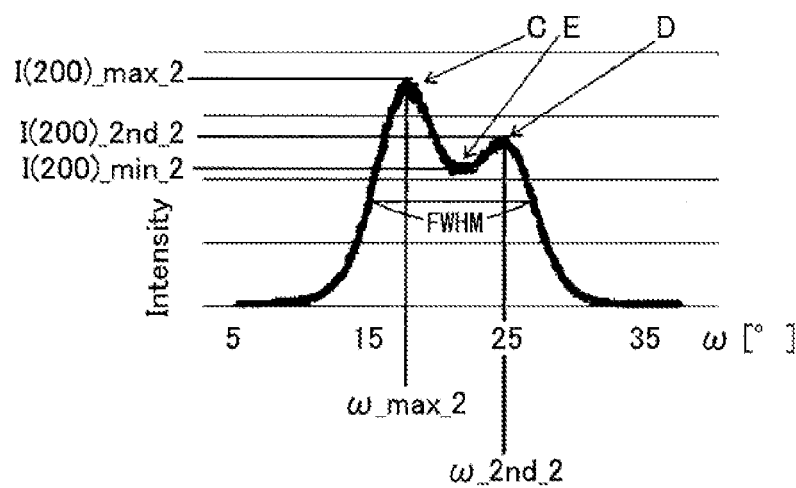

For a PZT film preferentially oriented with a {100} plane, measurement by the rocking curve method is performed for the PZT film in which asymmetry of the shape of the peak of diffraction intensity obtained by measurement by the θ-2θ method of X-ray diffraction is great, as shown in FIG. 3A. FIGS. 5A to 5C are diagrams illustrating examples of diffraction intensity curves obtained by performing measurement by the rocking curve method on a {200} plane for the above-described PZT film. In Figures, abscissa represents an incident angle of X-rays to a measurement surface of the PZT film, and ordinate represents diffraction intensity of diffraction X-rays reflected from the measurement surface.

FIG. 5A is a diagram illustrating an example of a diffraction intensity curve in which asymmetry of the shape of the peak of diffraction intensity becomes smaller. It is shaped like a normal distribution. FIG. 5B is a diagram illustrating an example of a diffraction intensity curve in which asymmetry of the shape of the peak of diffraction intensity is great and the shape has two or more bending points. In FIG. 5B, the curve has a shape bending at points "A" and "B". FIG. 5C is a diagram illustrating an example of a diffraction intensity curve in which asymmetry of the shape of the peak of diffraction intensity is great and which has two or more local maximum points. In FIG. 5C, the curve has a shape having local maximums at points "C" and "D" and having a local minimum at point "E" between the points "C" and "D".

Furthermore, for electromechanical conversion elements using the PZT films having the properties illustrated in FIGS. 5A to 5C, strain displacements are measured, respectively. As a result, it is found that in a case of using the PZT films having the property shown in FIG. 5B or 5C, the strain displacement becomes greater compared with a case of using the PZT film having the property shown in FIG. 5A.

For a PZT film preferentially oriented with a {100} plane, in a case of using $PbTiO_3$ for a material of the first oxide layer 408 shown in FIG. 1, it becomes easier to obtain the shape of the peak of diffraction intensity having the asymmetry shown in FIGS. 5B and 5C. The reason of this is considered to be the following.

Figure 6A:
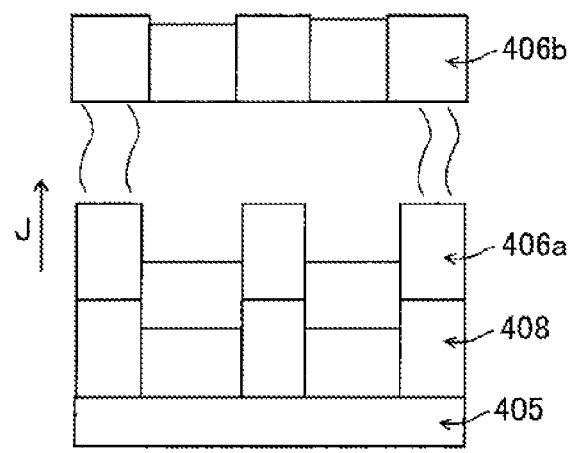
FIGS. 6A and 6B are diagrams schematically illustrating an example of a crystal structure of a PZT film in a case of using PbTiO$_3$ for a first oxide layer according to the present embodiment.
Figure 6B:
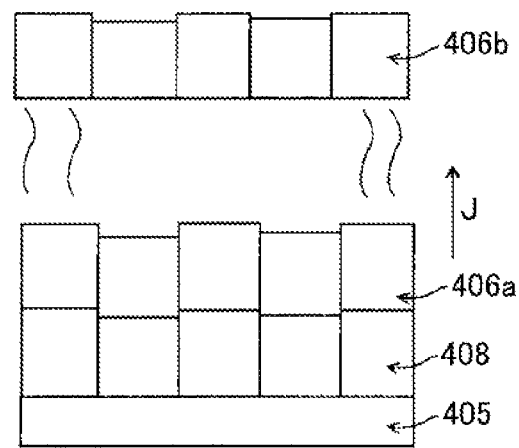

FIGS. 6A and 6B are diagrams schematically illustrating an example of a crystal structure of the PZT film 406. FIG. 6A illustrates a case where irregularity of a layer surface of a base of the PZT film 406 is great, and FIG. 6B illustrates a case where irregularity of the layer surface of the base of the PZT film 406 is small. Meanwhile, an arrow J in each of figures represents a growth direction of crystal of the PZT film 406.

In a case of using $PbTiO_3$ for a material of the first oxide layer 408, a crystal structure of the first oxide layer 408 includes the tetragonal a-axis domain structure and the tetragonal c-axis domain structure, and the irregularity of the layer surface of the first oxide layer 408 becomes greater. That is, the crystal structure of the PZT film 406 is as shown in FIG. 6A. Since a layer 406a of the PZT film 406 at an interface to the first oxide layer 408 is affected by the base, it is more likely to become two crystal structures of the tetragonal a-axis domain structure and the tetragonal c-axis domain structure. In this layer, irregularity of the layer surface also becomes greater. However, as the PZT film 406 grows, this irregularity of the layer surface gradually decreases. For a layer 406b of the PZT film 406 around an interface to the second oxide film layer 409, irregularity of a layer surface is quite small. A crystal structure of this layer includes the tetragonal a-axis domain structure 406a, the tetragonal c-axis domain structure 406b and the structure 406c of any one of rhombohedral, orthorhombic and quasi-cubic.

On the other hand, as shown in FIG. 6B, in a case where the irregularity of the layer surface of the base is small, for all the layers of the PZT film 406, the crystal structure includes the tetragonal a-axis domain structure 406a, the tetragonal c-axis domain structure 406b and the structure 406c of any one of rhombohedral, orthorhombic and quasi-cubic. That is, great difference does not occur between extents of irregularities of layer surfaces for a layer positioned at an upper portion of the PZT film 406 and for a layer positioned at a lower portion.

It is considered that in a case where for the PZT film, great difference occurs between extents of irregularities of layer surfaces for the layer 406a and for the layer 406B. According to an influence from tiny distortion of the crystal lattice due to this difference, asymmetry of the form of the peak of diffraction intensity becomes greater, as shown in FIGS. 5B and 5C, thereby the curve has two or more bending points or local maximum points. On the other hand, it is considered that in a case where for the PZT film, there is not great difference between extents of irregularities of layer surfaces for the layer 406a and for the layer 406b, asymmetry of the form of the peak of diffraction intensity is small, as shown in FIG. 5A, thereby the curve is shaped like a normal distribution.

It is considered that in a case of the PZT film having the property shown in FIG. 5B or 5C, as described above, great difference occurs between extents of irregularities of layer surfaces for the upper portion of the film and for the lower portion, and distortion of the crystal lattice occurs. Although details are not fully known, it is considered that in a case where such distortion of the crystal lattice occurs, density of anti-180° domain walls becomes greater, thereby the effect of domain rotation can be enhanced. The reason why the strain displacement of the electromechanical conversion element becomes greater in the case of using the PZT film having the property shown in FIG. 5B or 5C is that the strain displacement according to the effect of the domain rotation is considered to become greater.

In FIG. 5B, in a case where the diffraction intensity at the bending point (point "A" in the figure) whose diffraction intensity is greater out of the two bending points is denoted by I{200}_max, and the diffraction intensity at the another point (point "B" in the figure) is denoted by I{200}_2nd, the value of I{200}_2nd/I{200}_max is preferably greater than or equal to 0.5 but less than or equal to 0.99, and is more preferably greater than or equal to 0.8 but less than or equal to 0.9.

Moreover, in a case where an angle between the film surface and the incident X-ray at the bending point (point "A" in the figure) whose diffraction intensity is greater out of the two bending points is denoted by ω_max, and an angle between the film surface and the incident X-ray at the another point (point "B" in the figure) is denoted by ω_2nd, the value of |ω_max−ω_2nd| is preferably greater than or equal to 2° but less than or equal to 20°, and is more preferably greater than or equal to 5° but less than or equal to 15°.

In FIG. 5C, in a case where the diffraction intensity at the local maximum point (point "C" in the figure) whose diffraction intensity is greater out of the two local maximum points is denoted by I{200}_max_2, and the diffraction intensity at the another point (point "D" in the figure) is denoted by I{200}_2nd_2, the value of I{200}_2nd_2/I{200}_max_2 is preferably greater than or equal to 0.5 but less than or equal to 0.99, and is more preferably greater than or equal to 0.7 but less than or equal to 0.9. In a case where the diffraction intensity at the local minimum point (point "E" in the figure) between the two local maximum points is denoted by I{200}_min_2, the value of I{200}_min_2/I{200}_max_2 is preferably greater than or equal to 0.3, and is more preferably greater than or equal to 0.5.

Moreover, in a case where an angle between the sample substrate surface and the incident X-ray at the local maximum point whose diffraction intensity is greater out of the two local maximum points is denoted by ω_max_2, and an angle between the sample substrate surface and the incident X-ray at the another point is denoted by ω_2nd_2, the value of |ω_max_2−ω2nd_2| is preferably greater than or equal to 2° but less than or equal to 20°, and is more preferably greater than or equal to 5° but less than or equal to 15°.

In a case where the values of I{200}_2nd/I{200}_max, I{200}_2nd_2/I{200}_max_2 and I{200}_min_2/I{200}_max_2 are less than the lower limits defined as described above (0.5, 0.5 and 0.3, respectively), a strain displacement increases locally. Then, in a case of driving continuously the electromechanical conversion element as a piezoelectric actuator, a defect such as a crack is likely to occur in the PZT film 406. In a case where such defect occurs by the continuous driving, a strain displacement after driving decreases from the initial strain displacement. Moreover, in a case where the values of I{200}_2nd/I{200}_max and I{200}_2nd_2/I{200}_max_2 are greater than the upper limits defined as described above (0.99 for each), the effect of the domain rotation becomes smaller, and a sufficient strain displacement in the electromechanical conversion element cannot be obtained.

Moreover, in a case where the values of (ω_max−ω2nd| and |ω_max_2−ω2nd_2| are less than the lower limits defined as described above (2° for each), since the distortion of the crystal structure of the PZT film becomes smaller, the effect of the domain rotation becomes smaller, and a sufficient strain displacement in the electromechanical conversion element cannot be obtained. In a case where the values of |ω_max−ω_2nd| and |ω_max_2−ω_2nd_2| are greater than the upper limits defined as described above (20° for each), since the distortion of the crystal structure of the PZT film becomes greater, the strain displacement by the domain rotation can be increased. However, in the case of continuously driving the electromechanical conversion element as the piezoelectric actuator, a defect such as a crack is likely to occur in the PZT film 406, and a strain displacement after driving decreases from the initial strain displacement.

In a case of having asymmetry as shown in FIG. 5B or 5C, a half maximum full-width (FWHM) is preferably greater than or equal to 6° but less than or equal to 16°, and is more preferably greater than or equal to 8° but less than or equal to 12°. In a case where the FWHM is less than the lower limit (6°), since the distortion of the crystal structure of the PZT film becomes smaller, the effect of the domain rotation decreases, and a sufficient strain displacement in the electromechanical conversion element cannot be obtained. Moreover, in a case where the FWHM is greater than the upper limit (16°), since the distortion of the crystal structure of the PZT film becomes greater, the strain displacement by the domain rotation can be increased. However, in the case of continuously driving the electromechanical conversion element as the piezoelectric actuator, a defect such as a crack is likely to occur in the PZT film 406, and a strain displacement after driving decreases from the initial strain displacement. Here, the FWHM is a width of ω, at which the diffraction intensity is a half of the maximum value, in the peak of the diffraction intensity obtained upon scanning the angle (ω) between the sample substrate surface and the incident X-ray in the measurement by rocking curve method.

Moreover, a crystal growth direction of a film to be measured is not necessarily perpendicular to the substrate surface of the film. In a case where the crystal growth direction of the film is not perpendicular to the substrate surface of the film, a crystal plane is inclined with respect to the substrate surface. In order to determine an extent of this inclination, at a position (2θ) where diffraction intensity becomes the maximum in measurement by the θ-2θ method, it is necessary to perform further measurement of changing a tilt angle (χ). Meanwhile, a "tilt angle" is assumed to represent an angle between a (lmn) plane (l, m and n are 0 or 1, respectively) of a crystal included in the electromechanical conversion film and a plane having an inclination with respect to the (lmn) plane, in a case where the (lmn) plane has an inclination with respect to the plane being parallel to the (lmn) plane.

Figure 7A:
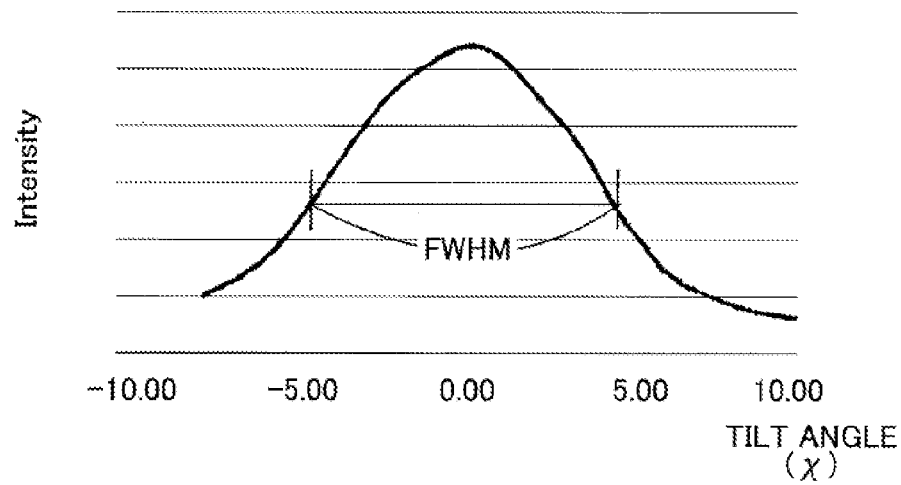
FIGS. 7A to 7C are diagrams illustrating examples of diffraction intensity curves obtained by measurement of changing a tilt angle for the PZT film preferentially oriented with a {100} plane according to the present embodiment.
Figure 7B:
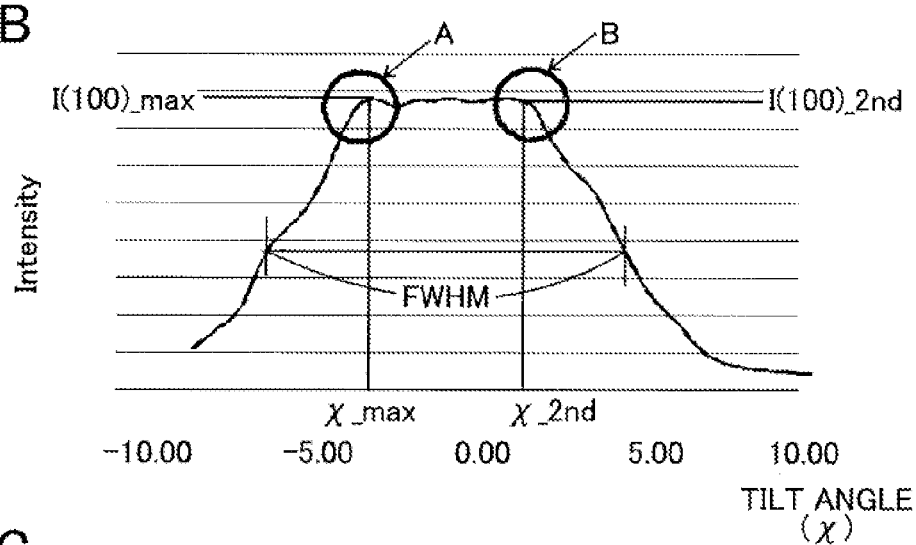
Figure 7C:
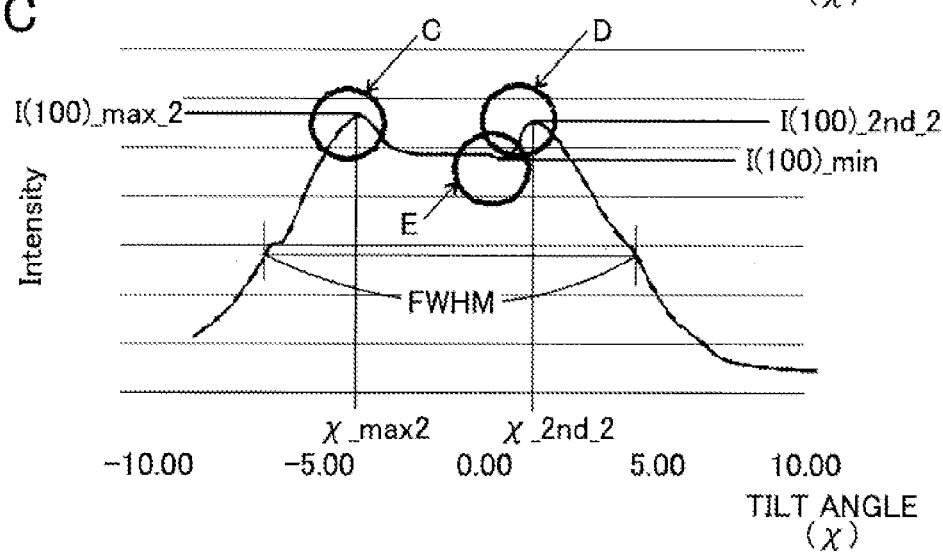

For a PZT film preferentially oriented with a {100} plane, further measurement of changing an tilt angle is performed for the PZT film in which asymmetry of the shape of the peak of diffraction intensity obtained by measurement by the θ-2θ method of X-ray diffraction is great, as shown in FIG. 3A. FIGS. 7A to 7C are diagrams illustrating examples of diffraction intensity curves in a case of continuously changing the tilt angle (χ) within a range of ±15° for the above-described PZT film. At a position (2θ) where diffraction intensity of a peak of the diffraction intensity corresponding to a {100} plane, among peaks of the diffraction intensity obtained by the measurement of the θ-2θ method, becomes the maximum, the tilt angle is changed. In figures, the abscissa represents the tilt angle (χ), and the ordinate represents diffraction intensity of diffraction X-ray reflected from the measurement surface.

FIG. 7A is a diagram illustrating an example of a diffraction intensity curve in which the shape of the peak of diffraction intensity is shaped like a normal distribution. FIG. 7B is a diagram illustrating an example of a diffraction intensity curve in which the shape of the peak of diffraction intensity has two or more bending points. As shown in FIG. 7B, the shape of the peak of the diffraction intensity has a shape bending at points "A" and "B". FIG. 7C is a diagram illustrating an example of a diffraction intensity curve in which the shape of the peak of diffraction intensity has two or more local maximum points. As shown in FIG. 7C, the shape of the peak of the diffraction intensity has a shape having local maximums at points "C" and "D" and having a local minimum at point "E" between the points "C" and "D".

Furthermore, for electromechanical conversion elements using the PZT films having the properties illustrated in FIGS. 7A to 7C, strain displacements are measured, respectively. As a result, it is found that in a case of using the PZT films having the property shown in FIGS. 7B and 7C, the strain displacement becomes greater compared with a case of using the PZT film having the property shown in FIG. 7A.

Figure 8A:
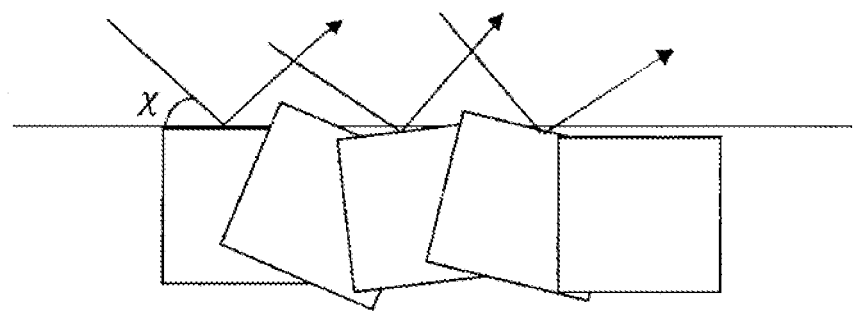
FIGS. 8A and 8B are diagrams schematically illustrating an example of the crystal structure of the PZT film in the case of using PbTiO$_3$ for the first oxide layer according to the present embodiment.
Figure 8B:
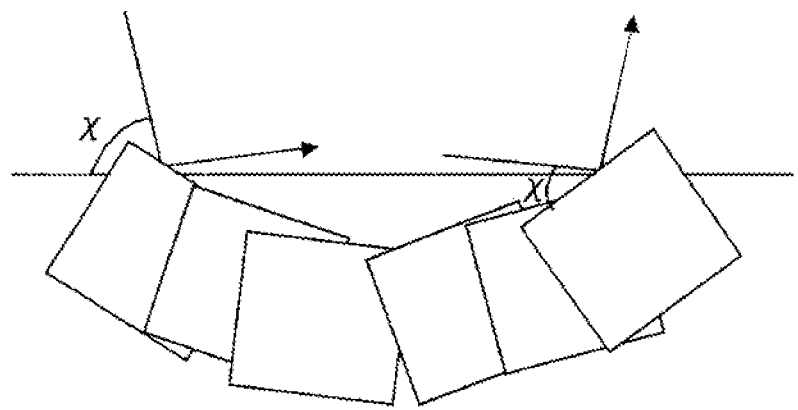

FIGS. 8A and 8B are diagrams schematically illustrating an example of a crystal structure of the PZT film 406. FIG. 8A illustrates a case where the inclination of the crystal plane with respect to the substrate surface of the PZT film 406 is small. FIG. 8B illustrates a case where the inclination of the crystal plane with respect to the substrate surface of the PZT film 406 is great. For the PZT film having the property shown in FIG. 7A, as shown in FIG. 8A, the inclination of the crystal plane with respect to the substrate surface of the PZT film 406 is considered to be small. On the other hand, for the PZT film having the property shown in FIG. 7B or 7C, as shown in FIG. 8B, the inclination of the crystal plane with respect to the substrate surface of the PZT film 406 is considered to be great.

It is considered that in a case where the inclination of the crystal plane with respect to the substrate surface of the PZT film 406 increases, distortion of the crystal lattice occurs. Although details are not fully known, it is considered that in a case where such distortion of the crystal lattice occurs, density of anti-180° domain walls becomes greater, thereby the effect of domain rotation can be enhanced. The reason why the strain displacement of the electromechanical conversion element becomes greater in the case of using the PZT film having the property shown in FIG. 7B or 7C, compared with the case of using the PZT film having the property shown in FIG. 7A, is considered to be according to the effect of the domain rotation.

In FIG. 7B, in a case where an angle between the film surface and the incident X-ray at the bending point (point "A" in the figure) whose diffraction intensity is greater out of the two bending points is denoted by $\chi\_max$, and an angle between the film surface and the incident X-ray at the another point (point "B" in the figure) is denoted by $\chi\_2nd$, the value of $|\chi\_max-\chi\_2nd|$ is preferably greater than or equal to 2° but less than or equal to 10°, and is more preferably greater than or equal to 4° but less than or equal to 8°.

In FIG. 7C, in a case where the diffraction intensity at the local maximum point (point "C" in the figure) whose diffraction intensity is greater out of the two local maximum points is denoted by $I\{100\}\_max\_2$, and the diffraction intensity at the local minimum point (point "E" in the figure) between the two local maximum points is denoted by $I\{100\}\_min\_2$, the value of $I\{100\}\_min\_2/I\{100\}\_max\_2$ is preferably greater than or equal to 0.5, and is more preferably greater than or equal to 0.7.

Moreover, in a case where an angle between the sample substrate surface and the incident X-ray at the local maximum point whose diffraction intensity is greater out of the two local maximum points is denoted by $\chi\_max\_2$, and an angle between the sample substrate surface and the incident X-ray at the another point is denoted by $\chi\_2nd\_2$, the value of $|\chi\_max\_2-\chi\_2nd\_2|$ is preferably greater than or equal to 2° but less than or equal to 8°, and is more preferably greater than or equal to 4° but less than or equal to 6°.

In a case where the value of $I\{100\}\_min\_2/I\{100\}\_max\_2$ is less than the lower limit defined as described above (0.5), a strain displacement increases locally. Then, in a case of driving continuously the electromechanical conversion element as a piezoelectric actuator, a defect such as a crack is likely to occur in the PZT film 406. In a case where such defect occurs by the continuous driving, a strain displacement after driving decreases from the initial strain displacement.

Moreover, in a case where the values of $|\chi\_max-\chi\_2nd|$ and $|\chi\_max\_2-\chi\_2nd\_2|$ are less than the lower limits defined as described above (2° for each), since the distortion of the crystal structure of the PZT film becomes smaller, the effect of the domain rotation becomes smaller, and a sufficient strain displacement in the electromechanical conversion element cannot be obtained. In a case where the values of $|\chi\_max-\chi\_2nd|$ and $|\chi\_max\_2-\chi\_2nd\_2|$ are greater than the upper limits defined as described above (10° and 8°, respectively), since the distortion of the crystal structure of the PZT film becomes greater, the strain displacement by the domain rotation can be increased. However, in the case of continuously driving the electromechanical conversion element as the piezoelectric actuator, a defect such as a crack is likely to occur in the PZT film 406, and a strain displacement after driving decreases from the initial strain displacement.

In a case of having the property shown in FIG. 7B or 7C, a half maximum full-width (FWHM) is preferably greater than or equal to 6° but less than or equal to 16°, and is more preferably greater than or equal to 8° but less than or equal to 12°. In a case where the FWHM is less than the lower limit (6°), since the distortion of the crystal structure of the PZT film becomes smaller, the effect of the domain rotation decreases, and a sufficient strain displacement in the electromechanical conversion element cannot be obtained. Moreover, in a case where the FWHM is greater than the upper limit (16°), since the distortion of the crystal structure of the PZT film becomes greater, the strain displacement by the domain rotation can be increased. However, in the case of continuously driving the electromechanical conversion element as the piezoelectric actuator, a defect such as a crack is likely to occur in the PZT film 406, and a strain displacement after driving decreases from the initial strain displacement. Here, the FWHM is a width of $\chi$, at which the diffraction intensity is a half of the maximum value, in the peak of the diffraction intensity obtained upon changing the tilt angle ($\chi$).

Assume $I\{hkl\}$ is a value obtained by integrating diffraction intensity at a peak of diffraction intensity corresponding to a $\{hkl\}$ plane, where h, k and l are arbitrary positive integers. Moreover, assume $\Sigma I\{hkl\}$ is a sum of $I\{hkl\}$. A ratio $\rho\{hkl\}$ of $I\{hkl\}$ to $\Sigma I\{hkl\}$, i.e. $I\{hkl\}/\Sigma I\{hkl\}$ represents a degree of orientation on the $\{hkl\}$ plane. The ratio $\rho\{hkl\}$ is preferably greater than or equal to 0.75, and is more preferably greater than or equal to 0.85. In a case where the ratio $\rho\{hkl\}$ is less than 0.75, since sufficient strain displacement according to the piezoelectric effect cannot be obtained, and a sufficient amount of displacement of the electromechanical conversion element cannot be secured.

Here, a detailed structure of the electromechanical conversion element including an insulation protection film or an extraction wiring will be explained.

FIG. 9 is a diagram schematically illustrating a configuration of the element including an insulation protection film or an extraction wiring. A first insulation protection film 500 includes a contact hole in a region indicated by dashed curve F in the figure, and has a configuration that a first electrode 405 and a first oxide layer 408 are electrically connected with a fifth electrode (common electrode wiring) 501 and a second electrode 407 and a second oxide layer 409 are electrically connected with a sixth electrode (individual electrode wiring) 502. Moreover, a second insulation protection film 503 for protecting the fifth electrode 501 and the sixth electrode 502 is formed. A part of the insulation protection film 503 is opened, and an electrode pad is arranged in the opening section. An electrode pad prepared for the fifth electrode is referred to as a fifth electrode pad 504 and an electrode pad prepared for the sixth electrode is referred to as a sixth electrode pad 505.

The first insulation protection film 500 has a role as a protection film for preventing damage from film formation/etching processing to the electromechanical conversion element, and also has a role of preventing atmospheric moisture from penetrating. A film of the first insulation protection film 500 is required to be thin, since in a case of the film being thick, vibration displacement of the vibration plate is blocked and discharge performance of the liquid drop discharge head is quite low. Then, for the first insulation protection film 500, a dense inorganic material such as oxide, nitride or carbide is preferably selected. Meanwhile, organic material is not preferable for the material of the first insulation protection film 500, since sufficient protection performance cannot be obtained if the film is not thick.

Moreover, for the material of the first insulation protection film 500, a material with high adhesion with a material of the electrode as a base, with a material of the electromechanical conversion film and with a material of the vibration plate is preferably selected. For the film formation method of the first insulation protection film 500, a plasma CVD (chemical vapor deposition) method and sputtering method are not preferable since the electromechanical conversion element may be damaged, but a vapor-deposition method or atomic layer deposition (ALD) method is preferable. The ALD method is more preferable, since the choice of materials to be used becomes wider. For example, $Al_2O_3$, $ZrO_2$, $Y_2O_3$, $Ta_2O_3$, $TiO_2$ or the like which is used for ceramics material can be used. By using the above-described materials and performing film formation using the ALD method, a thin film whose film density is quite high, and which well prevents damage during film formation/etching processing, can be prepared.

The film thickness of the first insulation protection film is preferably greater than or equal to 20 nm but less than or equal to 100 nm. In a case where the film thickness of the first insulation protection film 500 is greater than 100 nm, as described above, the discharge performance of the liquid drop discharge head becomes lower. On the other hand, in a case where the film thickness of the first insulation protection film 500 is less than 20 nm, function as a protection film will be insufficient, and performance of the electromechanical conversion element is degraded.

The first insulation protection film 500 may include two layers. For example, in case where a first insulation protection film is thin and a second insulation protection film is thick, an opening section is formed in the second insulation protection film around the first oxide layer 408, so as not to disturb the vibration displacement of the vibration plate 402. In this case, since for the second insulation protection film, an arbitrary oxide, nitride, carbide or complex compound thereof can be used, $SiO_2$ which is generally used for semiconductor devices can be used. For the film formation method, an arbitrary film formation method, such as CVD method or sputtering method can be used, but the CVD method which can form film isotropically is preferably used, taking account that step coverage in a pattern formation part such as an electrode formation part is necessary.

The film thickness of the second insulation protection layer is required to fall within a range in which insulation breakdown does not occur by an electric field formed by an electric voltage applied between the fifth electrode 501 and the sixth electrode 502. Taking account of a condition of a surface on a base of the first insulation protection film 500, a pin hole or the like, the film thickness is required to be greater than or equal to 200 nm, and is more preferably greater than or equal to 500 nm.

For the fifth electrode 501 and the sixth electrode 502, metallic electrode material including either of Ag alloy, Cu, Al, Au, Pt and Ir is preferably used. A preparation method includes, for example, performing film formation using sputtering method or spin coat method, and then acquiring desired patterns by photolitho-etching method. The film thickness is preferably is preferably greater than or equal to 0.1 μm but less than or equal to 20 μm, and is more preferably greater than or equal to 0.2 μm but less than or equal to 10 μm. In a case where the film thickness is less than 0.2 μm, resistance of the film becomes great and sufficient electric current cannot be applied to the electrode, and the discharge from the liquid drop discharge head becomes unstable. On the other hand, in a case where the film thickness is greater than 10 μm, process time for preparing the electrode becomes longer.

Contact resistances of the fifth electrode 501 and the sixth electrode 502 at a contact hole part (10 μm×10 μm) are preferably less than or equal to 10Ω for the fifth electrode 501 and less than or equal to 1Ω, respectively. Furthermore, they are more preferably less than or equal to 5Ω for the fifth electrode 501 and less than or equal to 0.5Ω for the sixth electrode 502, respectively. In a case where the contact resistances of the fifth electrode 501 and the sixth electrode 502 are greater than the above-described upper limits (10Ω and 1Ω, respectively), sufficient electric currents cannot be supplied to the electrodes, and the discharge performance of the liquid drop discharge head are degraded.

The second insulation protection film 503 has a role as a protection film for protecting the sixth electrode 502 and the fifth electrode 501. For a material of the second insulation protection film 503, an inorganic material or an organic material can be used arbitrarily, but a material with low moisture permeability is preferably selected. For example, the inorganic material includes oxide, nitride or carbide, and the organic material includes polyimide, acrylic resin, urethane resin or the like. However, since for the organic material the film thickness is required to be thicker and is unsuitable for patterning, which will be described later, the inorganic material is preferably selected. Among the inorganic materials, especially, $Si_3N_4$ having a good track record in forming on Al wiring in a semiconductor device is preferably used. Moreover, a film thickness of the second insulation protection film 503 is preferably greater than or equal to 200 nm, and is more preferably greater than or equal to 500 nm. In a case where the film thickness is small, sufficient passivation function cannot be achieved. Then, the reliability of the liquid drop discharge head is degraded, such that a breaking due to corrosion of the sixth electrode 502 or the fifth electrode 501 occurs easily.

Opening sections are preferably formed on the electromechanical conversion element and on the vibration plate 402 around it. The reason is the same as that for making an individual liquid chamber region thinner in the above-described first insulation protection film 500. Therefore, the discharge performance and reliability of the liquid drop discharge head can be enhanced. Since a piezoelectric element is protected by the first insulation protection film 500 or the second insulation protection film 503, the opening section can be formed by using photolithography and dry etching.

An area of the fifth electrode pad 504 and the sixth electrode pad 505 is preferably greater than or equal to 50×50 μm², and is more preferably greater than or equal to 100×300 μm². In a case where the area of the fifth electrode pad 504 and the sixth electrode pad 505 is less than 50×50 μm², since a sufficient polarization treatment cannot be performed, there is a problem in durability, such that when driving continuously the electromechanical conversion element as a piezoelectric actuator, a strain displacement after driving gradually decreases from an initial strain displacement.

Figure 10:
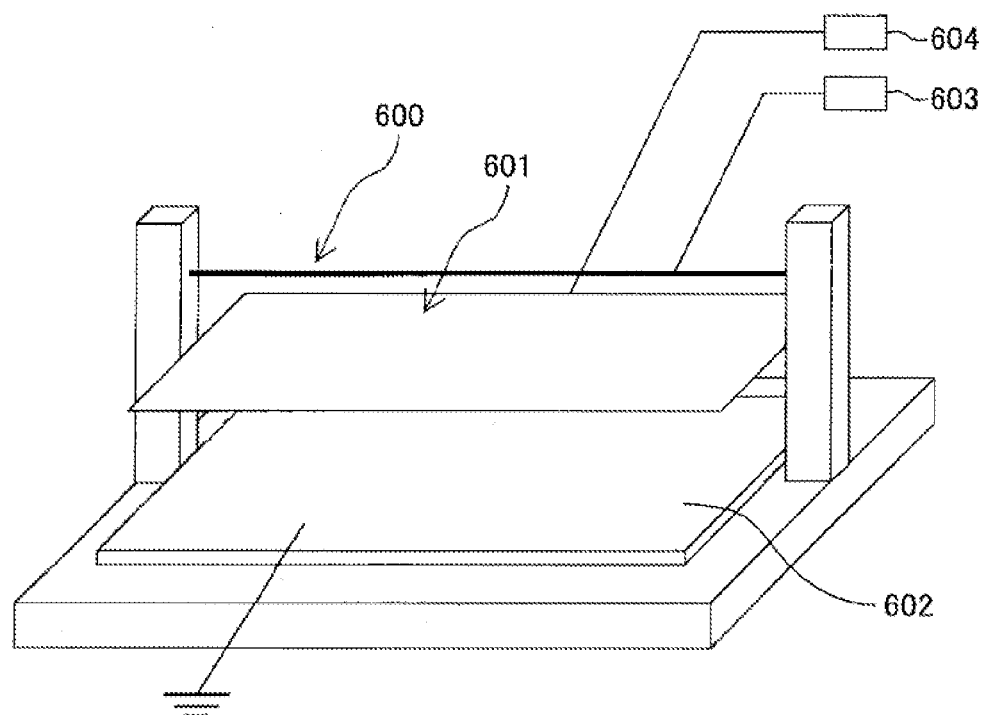
FIG. 10 is a perspective view schematically illustrating an example of a configuration of a polarization treatment device according to the present embodiment.

Polarization treatment is performed for the prepared piezoelectric element by using a polarization treatment device. FIG. 10 is a diagram schematically illustrating a configuration of the polarization treatment device. The polarization treatment device is provided with a corona electrode 600, a grid electrode 601, a stage 602 for setting a sample and the like. To the corona electrode 600, a corona power source 603 is connected. To the grid electrode 601, a grid electrode power source 604 is connected. To the stage 602, a temperature control function is added. According to the temperature control function, the polarization treatment can be performed at temperature up to about 350[° C.]. Moreover, the stage 602 is grounded. The grid electrode 601 is subjected to mesh processing so that ions, electric charges or the like generated by corona discharge, when a high electric voltage is applied to the corona electrode 600, efficiently fall onto a sample arranged in a lower part. By changing an electric voltage applied to the corona electrode 600 or the grid electrode 601, or distances between the sample and the respective electrodes, strength of the corona discharge can be controlled.

Figure 11A:
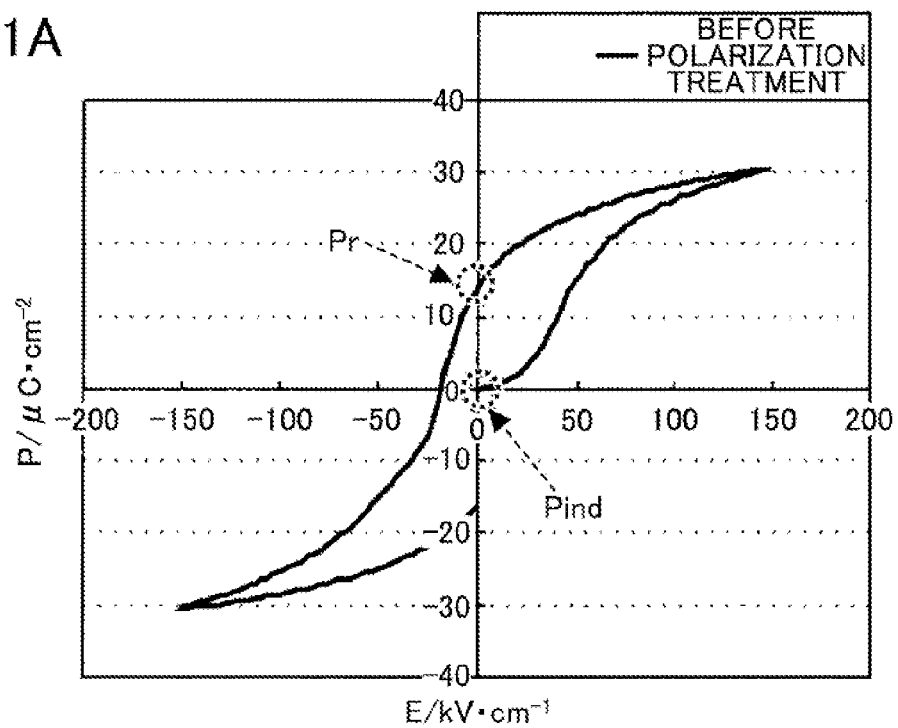
FIGS. 11A and 11B are diagrams illustrating examples of P-E hysteresis curves according to the present embodiment.
Figure 11B:
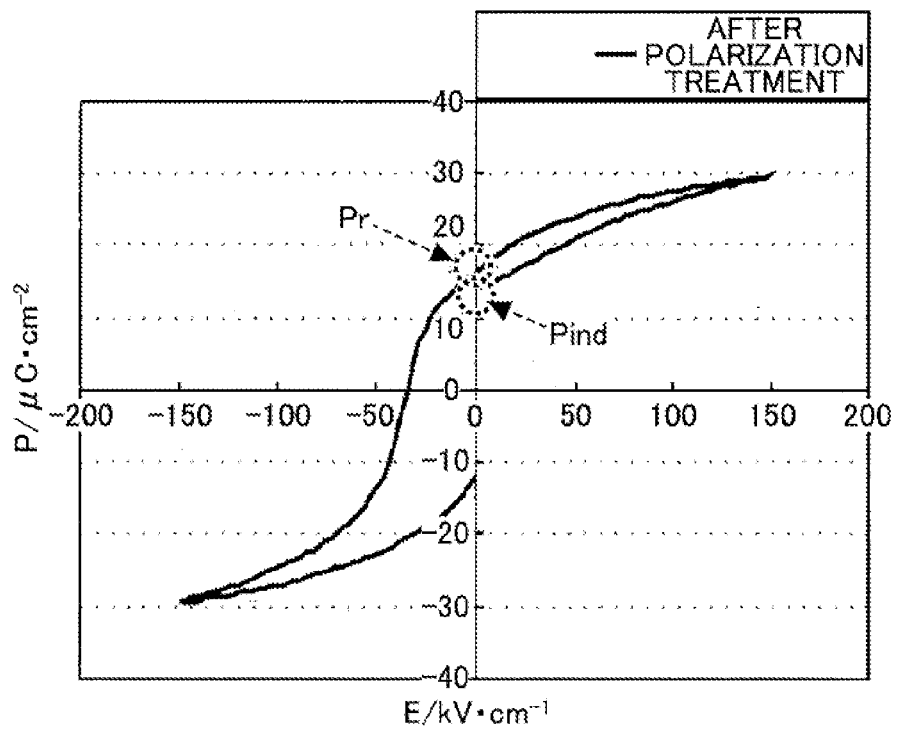

A state of polarization by the polarization treatment is determined by a P-E hysteresis loop, shown in FIGS. 11A and 11B. By applying an electric field of strength of ±150 kV/cm, to the electromechanical conversion film, the hysteresis loop is measured. In FIG. 11, Pind is polarization at the initial point of 0 kV/cm, and Pr is polarization at the point of 0 kV/cm after applying the electric voltage of +150 kV/cm and returns to 0 kV/cm. Polarizability is defined by a difference between Pr and Pind, i.e. Pr-Pind, and the state of polarization is determined by the polarizability.

As shown in FIG. 11A, the polarizability is about 15 $\mu C/cm^2$ before performing the polarization treatment, but the polarizability is about 2 $\mu C/cm^2$ after performing the polarization treatment, as shown in FIG. 11B. The polarizability is preferably less than or equal to 10 $\mu C/cm^2$, and is more preferably less than or equal to 5 $\mu C/cm^2$. In a case where the polarizability is greater than 10 $\mu C/cm^2$, there is a problem in durability, such that when driving continuously the electromechanical conversion element as a piezoelectric actuator, a strain displacement after driving gradually decreases from an initial strain displacement. By controlling the strength of the corona discharge using the above-described method, desired polarizability can be obtained.

Figure 9A:
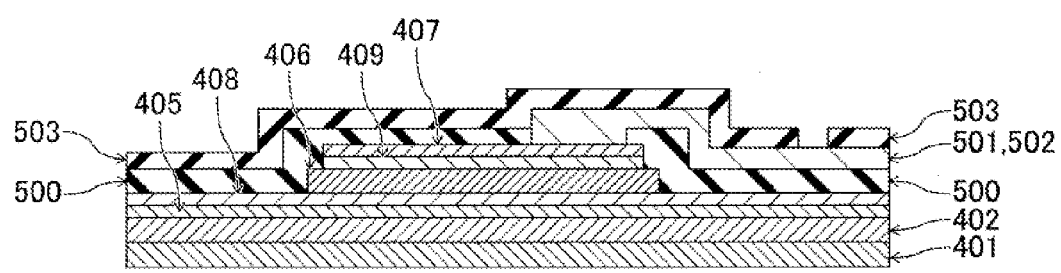
FIGS. 9A and 9B are cross-sectional diagrams schematically illustrating an example of a configuration of an electromechanical conversion element of the liquid drop discharge head according to the present embodiment.
Figure 9B:
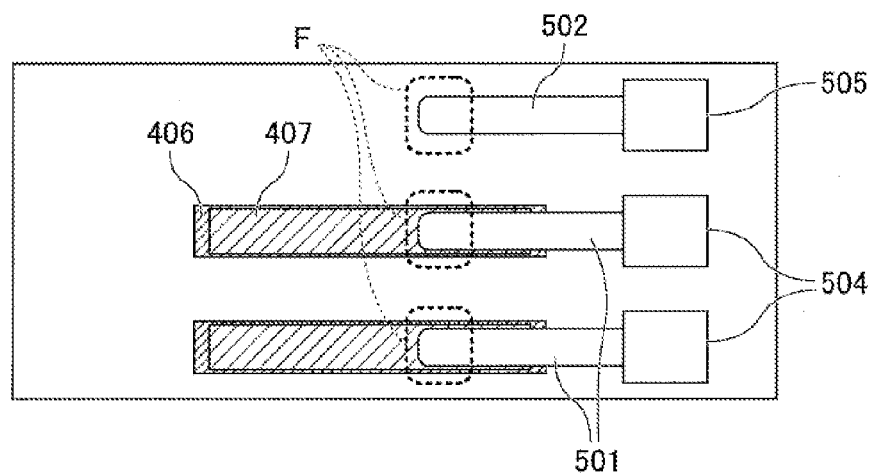
Figure 12:
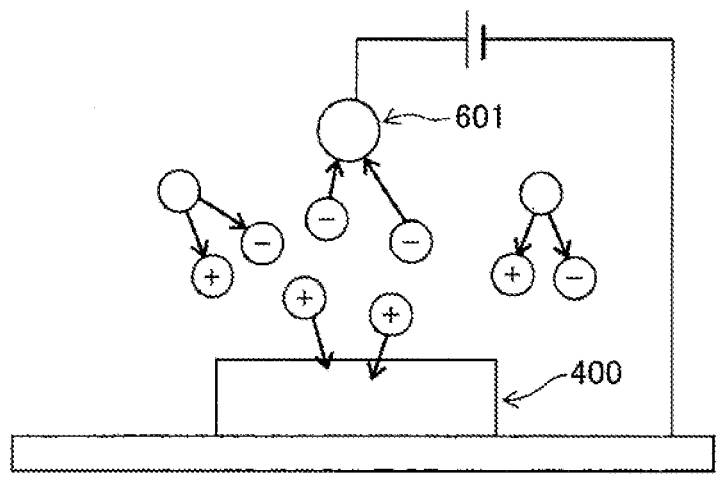
FIG. 12 is a diagram for explaining a principle of the polarization treatment according to the present embodiment.

As shown in FIG. 12, in a case of performing the corona discharge using the corona electrode 600, molecules in the atmosphere are ionized and cations are generated. These cations flow into the electromechanical conversion element 400 via the fifth electrode pad 504 of the electrode (see FIGS. 9A and 9B), and electric charges are accumulated. It is considered that in the electromechanical conversion element 400 as shown in FIGS. 9A and 9B, potential difference between top and bottom of the electromechanical conversion element is caused by difference between amounts of electric charge accumulated in the second electrode 407 as an upper electrode and in the first electrode 405 as a lower electrode, and thereby the polarization treatment is performed. An amount of electric charge Q required for the polarization treatment is preferably greater than or equal to 1E-8 C, and is more preferably greater than or equal to 4E-8 C. In a case the amount of electric charge Q is less than 1E-8 C, sufficient polarization treatment is not performed, when driving continuously the electromechanical conversion element as an actuator, sufficient characteristic of strain displacement cannot be obtained.

Next, an example in the present embodiment according to the present invention will be explained more specifically with a comparative example.

First Example

On a silicon wafer of 6 inches as a substrate, a $SiO_2$ film (film thickness: about 1.0 μm) as a vibration plate is formed. On the $SiO_2$ film, a Ti film (film thickness: about 20 nm) is formed at 350[° C.] by sputtering method, and is subjected to thermal oxidization at 750[° C.] by rapid thermal annealing (RTA). Subsequently, a Pt film (film thickness: about 160 nm) is formed as a first electrode (lower electrode) at about 300[° C.] by a sputtering method. A $TiO_2$ film obtained by thermally oxidizing the Ti film has a role of an adhesion layer between the $SiO_2$ film and the Pt film.

Next, PT application liquid is prepared by mixing Pb and Ti with a composition ratio of Pb:Ti=1:1 as a material of a $PbTiO_3$ (PT) layer, which is a first oxide layer to be a base layer of a PZT film. Moreover, PZT precursor application liquid, which is a solution obtained by mixing Pb, Zr and Ti with a composition ratio of Pb:Zr:Ti=115:49:51 as a material of the PZT film, is prepared. Synthesis of the PZT precursor application liquid is schematically performed as follows. First, for starting materials, lead acetate 3 hydrate, titanium isopropoxide and zirconium isopropoxide are used. Crystallization water of lead acetate is dissolved in methoxy ethanol and afterwards dehydrated. A lead amount is made excessive over the stoichiometric composition. This is for preventing degradation of crystallinity due to so-called lead missing during heat treatment. Titanium ixopropxide and zirconium isopropoxide are dissolved in methoxy ethanol, an alcohol exchange reaction and an esterification reaction are processed and mixed with the above-described methoxy ethanol solution in which lead acetate is dissolved, and thereby the PZT precursor application liquid is synthesized. A concentration of this PZT is 0.5 mol/l. Also for PT application liquid, synthesis is performed in the same way as the PZT precursor application liquid.

Using the above-described application liquid, first, a PT layer is formed by spin coat, afterwards, desiccation is performed at 120 [° C.] by hot plate. Then, a PZT film is formed by spin coat, and desiccation (120[° C.]) and thermal decomposition (400[° C.]) are performed by hot plate. The above-described process of application of the PZT precursor solution, desiccation and thermal decomposition is repeated three times, and thereby three layers are formed. After the thermal decomposition processing for the third layer, heat treatment for crystallization (at temperature of 730[° C.]) is performed by rapid thermal annealing (RTA). The film thickness of the PZT film upon finishing the above-described heat treatment for crystallization is 240 nm. The above-described process of application of the PZT precursor solution, desiccation, thermal decomposition and heat treatment for crystallization is conducted eight times in total (24 layers), and a PZT film having film thickness of about 2.0 μm is obtained.

Next, on the above-described PZT film, a $SrRuO_3$ film (film thickness: 40 nm) as a second oxide layer and a Pt film (film thickness: 125 nm) as a second electrode (upper electrode) are formed by sputtering method, respectively. Then, photo resist (TSMR 8800) manufactured by Tokyo Ohka Kogyo Co., Ltd. is formed is formed by spin coat method, and afterwards a pattern as shown in FIG. 12 is formed by photolithography and etching. Meanwhile, for etching, an ICP etching device manufactured by Samco Inc. is used.

The pattern formation is followed by a film formation of an $AL_2O_3$ film (film thickness: 50 nm) as a first insulation protection film by ALD method. As raw materials for the $AL_2O_3$ film, trimethylaluminum (TMA) manufactured by Sigma- Aldrich Co. LLC for AL and $O_3$ generated by an ozone generator are used. Then, the film formation of $AL_2O_3$ film is performed by alternately laminating AL and $O_3$. A contact hole section is formed on the first insulation protection film by etching. Then, AL layers as a fifth electrode and a sixth electrode are formed by a sputtering method, respectively, after performing pattern formation by photolithography and etching, an $Si_3N_4$ layer (film thickness: 500 nm) as a second insulation protection film is formed by plasma CVD. Finally, a pressure liquid chamber is formed on the substrate by anisotropic wet etching by alkali solution (KOH solution or TMHA (tetramethylammoniumhydroxide) solution). According to the above, a liquid drop discharge head provided with a piezoelectric actuator (thin film PZT actuator) as an electromechanical piezoelectric element is prepared.

After this, polarization treatment is performed by corona electrification treatment. For the corona electrification treatment, a tungsten wire of $\phi 50$ μm is used. The polarization treatment is performed under a polarization treatment condition where treatment temperature is 80[° C.], corona electric voltage is 9 kV, grid electric voltage is 2.5 kV, treatment time is 30 s, a distance between the corona electrode and the grid electrode is 4 mm and a distance between the grid electrode and the stage is 4 mm. Moreover, a distance between the two sixth electrode pads is 80 μm.

Second Example

A liquid drop discharge head is prepared by the same method as in the first example other than that the film thickness of the Ti film formed on the $SiO_2$ film as a vibration plate is about 50 nm and temperature of thermal decomposition after forming the PZT film is 350° C.

Third Example

A liquid drop discharge head is prepared by the same method as in the first example other than that the film thickness of the Ti film formed on the $SiO_2$ film as a vibration plate is about 50 nm, the temperature of film formation is 500° C. and the temperature of thermal decomposition after forming the PZT film is 350° C.

Fourth Example

A liquid drop discharge head is prepared by the same method as in the first example other than that the temperature of film formation of the Ti film formed on the $SiO_2$ film as a vibration plate is 500 [° C.], the temperature of desiccation after forming the PZT film is 140[° C.] and the temperature of thermal decomposition is 350° C.

Fifth Example

A liquid drop discharge head is prepared by the same method as in the first example other than that the film thickness of the Ti film formed on the $SiO_2$ film as a vibration plate is about 50 nm and the temperature of film formation is 500° C.

Sixth Example

A liquid drop discharge head is prepared by the same method as in the first example other than that the temperature of film formation of the Ti film formed on the $SiO_2$ film as a vibration plate is 500 [° C.] and the temperature of desiccation after forming the PZT film is 140[° C.].

First Comparative Example

A liquid drop discharge head is prepared by the same method as in the first example other than that after the film formation of the Ti film formed on the $SiO_2$ film as a vibration plate, a $TiO_2$ layer with thickness of 5 nm to be a base layer is formed by sputtering method instead of a $PbTiO_3$ layer as a first oxide layer.

For the liquid drop discharge heads of the first to sixth examples and the first comparative example, evaluation is performed for strain displacement (piezoelectric constant) in an initial state of electromechanical conversion element and in a state immediately after an endurance test in a state where a back side of the substrate is grooved. The endurance test is to repeat application of an electric voltage 1010 times after initial evaluation of piezoelectric constant. The piezoelectric constant is calculated by measuring an amount of strain deformation of the electromechanical conversion element, when an electric field of 150 kV/cm is formed by applying an electric voltage, by a laser Doppler vibrometer from the back side of the substrate, and by performing matching by simulation. Furthermore, crystallinity evaluation is performed for the PZT films of the first to sixth examples and the first comparative example by using X-ray diffraction in a state where the back side of the substrate is grooved.

In the first to sixth examples and the first comparative example, according to measurement by θ-2θ method of X-ray diffraction, every orientation rate on {100} plane is found to be greater than or equal to 80%. That is, it is confirmed that every PZT film in the first to sixth examples and the first comparative example is a film preferentially oriented with {100} plane.

Results of analysis for diffraction intensity obtained by performing measurement by rocking curve method on a {200} plane for the PZT films of the electromechanical conversion elements of the first to sixth examples and the first comparative example are shown in Table 1. A shape of a peak of diffraction intensity is shown by indicating to which shape of those shown in FIGS. 5A to 5C it corresponds. Furthermore, the piezoelectric constants of the electromechanical conversion elements of the first to sixth examples and the first comparative example are also measured and results thereof are shown in Table 1.

TABLE 1

| | | | | | | | Piezoelectric constant (d31) [pm/V] | |
| --- | --- | --- | --- | --- | --- | --- | --- | --- |
| | Shape of peak | $I(200)_{2nd}/I(200)_{max}$ | $|\omega_{max}-\omega_{2nd}|$ [°] | $I(200)_{2nd\_2}/I(200)_{max\_2}$ | $I(200)_{2nd\_2}/I(200)_{max\_2}$ | $|\omega_{max\_2}-\omega_{2nd\_2}|$ [°] | Initial | After 1010 times |
| First example | FIG. 5B | 0.80 | 5 | — | — | — | 144 | 141 |

TABLE 1-continued

| | Shape of peak | $I(200)_{2nd}/I(200)_{max}$ | $|\omega_{max}-\omega_{2nd}|$ [°] | $I(200)_{2nd\_2}/I(200)_{max\_2}$ | $I(200)_{2nd\_2}/I(200)_{max\_2}$ | $|\omega_{max\_2}-\omega_{2nd\_2}|$ [°] | Piezoelectric constant (d31) [pm/V] Initial | Piezoelectric constant (d31) [pm/V] After 1010 times |
|---|---|---|---|---|---|---|---|---|
| Second example | FIG. 5B | 0.60 | 4 | — | — | — | 139 | 135 |
| Third example | FIG. 5B | 0.60 | 15 | — | — | — | 154 | 143 |
| Fourth example | FIG. 5C | — | — | 0.60 | 0.40 | 14 | 158 | 144 |
| Fifth example | FIG. 5C | — | — | 0.80 | 0.70 | 6 | 146 | 137 |
| Sixth example | FIG. 5C | — | — | 0.86 | 0.76 | 3 | 140 | 135 |
| First Comparative example | FIG. 5A | — | — | — | — | — | 120 | 114 |

The shapes of peaks of diffraction intensity obtained by rocking curve method in the first to third examples are that shown in FIG. 5B, and the shapes in the fourth to sixth examples are that shown in FIG. 5C. For the first to third examples, $\omega_{max}-\omega_{2nd}|$ is greater than or equal to 2° but less than or equal to 20°, and $I\{200\}\_2nd/I\{200\}\_max$ is greater than or equal to 0.5 but less than or equal to 0.99. For the fourth to sixth examples, $|\omega\_max\_2-\omega\_2nd\_2|$ is greater than or equal to 2° but less than or equal to 20°, $I\{200\}\_2nd\_2/I\{200\}\_max\_2$ is greater than or equal to 0.5 but less than or equal to 0.99 and $I\{200\}\_min\_2/I\{200\}\_max\_2$ is greater than or equal to 0.3. Moreover, every initial piezoelectric constant and every piezoelectric constant after the endurance test in the first to sixth examples fall within a range from −120 to −160 pm/V, and it is confirmed that piezoelectric constants equivalent to general ceramics sintered bodies can be obtained.

On the other hand, for the first comparative example, the shape of the peak of diffraction intensity obtained by the rocking curve method indicates the one shown in FIG. 5A. It is considered that since an effect of domain rotation cannot be obtained sufficiently by the electromechanical conversion element using the PZT film whose peak of diffraction intensity has the shape shown in FIG. 5A, as described above, the strain displacement is lowered.

In the third example, $|\omega\_max-\omega\_2nd|$ is greater than those in the first and second examples. Moreover, in the fourth example, $|\omega\_max\_2-\omega\_2nd\_2|$ is greater than those in the fifth and sixth examples. Initial piezoelectric constants of the third and fourth examples are greater than those in the other examples. On the other hand, a ratio of degradation of the piezoelectric constant immediately after the endurance test from the initial piezoelectric constant (initial piezoelectric constant−piezoelectric constant immediately after endurance test)/initial piezoelectric constant) in the third or fourth example is slightly higher than those in the other examples. It is confirmed that as $|\omega\_max-\omega2nd|$ or $|\omega\_max\_2-\omega2nd\_2|$ increases, durability of the electromechanical conversion element gradually degrades.

However, although the initial piezoelectric constants in the third and fourth examples are slightly greater than the other examples, the piezoelectric constants immediately after the endurance test are almost the same among the first to sixth examples. That is, it is confirmed that as long as $|\omega\_max-\omega\_2nd|$ or $|\omega\_max\_2-\omega\_2nd\_2|$ falls within the range from 2° to 20°, even in the case where the initial piezoelectric constant is increased and after the electromechanical conversion element is caused to continuously operate, a good piezoelectric constant can be maintained.

Results of analysis for diffraction intensity obtained by performing measurement by changing a tilt angle for the PZT films of the electromechanical conversion elements of the first to sixth examples and the first comparative example are shown in Table 2. A shape of a peak of diffraction intensity is shown by indicating to which shape of those shown in FIGS. 7A to 7C it corresponds. Furthermore, the piezoelectric constants of the electromechanical conversion elements of the first to sixth examples and the first comparative example are also measured and results thereof are shown in Table 2.

TABLE 2

| | Shape of peak | $|\chi_{max}-\chi_{2nd}|$ [°] | $I(100)_{min}/I(100)_{max\_2}$ | $|\chi_{max\_2}-\chi_{2nd\_2}|$ [°] | $|\omega_{max}-\omega_{2nd}|$ [°] | $I(200)_{min\_2}/I(200)_{max\_2}$ | $|\omega_{max\_2}-\omega_{2nd\_2}|$ [°] | Piezoelectric constant (d31) [pm/V] Initial | Piezoelectric constant (d31) [pm/V] After 1010 times |
|---|---|---|---|---|---|---|---|---|---|
| First example | FIG. 7B | 4 | — | — | 5 | — | — | 144 | 141 |
| Second example | FIG. 7B | 4 | — | — | 4 | — | — | 139 | 135 |
| Third example | FIG. 7B | 8 | — | — | 15 | — | — | 154 | 143 |
| Fourth example | FIG. 7C | — | 0.65 | 7 | — | 0.40 | 14 | 158 | 144 |

TABLE 2-continued

| | Shape of peak | $|\chi_{max}-\chi_{2nd}|$ [°] | $I(100)_{min}/I(100)_{max\_2}$ | $|\chi_{max\_2}-\chi_{2nd\_2}|$ [°] | $|\omega_{max}-\omega_{2nd}|$ [°] | $I(200)_{min\_2}/I(200)_{max\_2}$ | $|\omega_{max\_2}-\omega_{2nd\_2}|$ [°] | Piezoelectric constant (d31) [pm/V] Initial | After 1010 times |
|---|---|---|---|---|---|---|---|---|---|
| Fifth example | FIG. 7C | | 0.80 | 4 | — | 0.70 | 6 | 146 | 137 |
| Sixth example | FIG. 7C | | 0.85 | 3 | — | 0.76 | 3 | 140 | 135 |
| First Comparative example | FIG. 7A | — | — | — | — | — | — | 120 | 114 |

The shapes of peaks of diffraction intensity obtained by performing measurement changing the tilt angle in the first to third examples are that shown in FIG. 7B, and the shapes in the fourth to sixth examples are that shown in FIG. 7C. For the first to third examples, |χ_max-χ_2nd| is greater than or equal to 2° but less than or equal to 10°. For the fourth to sixth examples, |χ_max_2-χ_2nd_2| is greater than or equal to 2° but less than or equal to 8°, and I{100}_min_2/I{100}_max_2 is greater than or equal to 0.5. Moreover, every initial piezoelectric constant and every piezoelectric constant after the endurance test in the first to sixth examples fall within a range from −120 to −160 pm/V, and it is confirmed that piezoelectric constants equivalent to general ceramics sintered bodies can be obtained.

On the other hand, for the first comparative example, the shape of the peak of diffraction intensity obtained by changing the tilt angle indicates the one shown in FIG. 7A. It is considered that since an effect of domain rotation cannot be obtained sufficiently by the electromechanical conversion element using the PZT film whose peak of diffraction intensity has the shape shown in FIG. 7A, as described above, the strain displacement is lowered.

In the third example, |χ_max-χ_2nd| is greater than those in the first and second examples. Moreover, in the fourth example, |χ_max_2-χ_2nd_2| is greater than those in the fifth and sixth examples. Initial piezoelectric constants of the third and fourth examples are greater than those in the other examples. On the other hand, a ratio of degradation of the piezoelectric constant immediately after the endurance test from the initial piezoelectric constant (initial piezoelectric constant−piezoelectric constant immediately after endurance test)/initial piezoelectric constant) in the third or fourth example is slightly higher than those in the other examples. It is confirmed that as |χ_max-χ_2nd| or |χ_max_2-χ_2nd_2| increases, durability of the electromechanical conversion element gradually degrades.

However, although the initial piezoelectric constants in the third and fourth examples are slightly greater than the other examples, the piezoelectric constants immediately after the endurance test are almost the same among the first to sixth examples. That is, it is confirmed that as long as |χ_max-χ_2nd| falls within the range from 2° to 10° or |χ_max_2-χ_2nd_2| falls within the range from 2° to 8°, the initial piezoelectric constant can be made sufficiently great and even in the case where after the electromechanical conversion element is caused to continuously operate, a good piezoelectric constant can be maintained.

Figure 13:
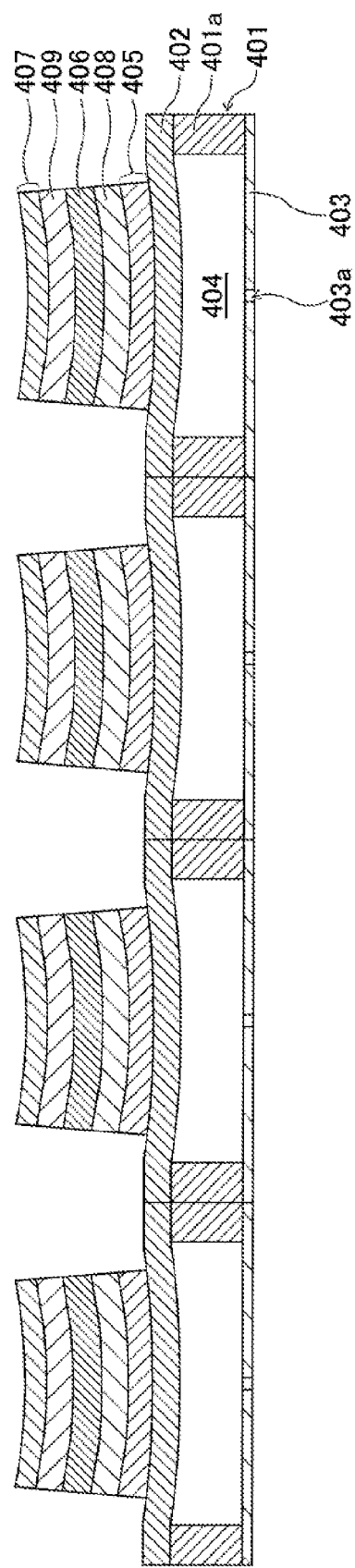
FIG. 13 is a cross-sectional diagram illustrating an example of a configuration in which plural liquid discharge heads according to the present embodiment are arranged.

Here, an example of configuration, in which plural liquid discharge heads, each provided with a piezoelectric actuator having a PZT film, are arranged, will be explained. FIG. 13 is a cross-sectional diagram illustrating an example of the configuration in which there are plural liquid discharge heads, each provided with the piezoelectric actuator having the PZT film 406, shown in FIG. 1, as above. According to the example of configuration, shown in FIG. 13, a piezoelectric actuator, as an electromechanical conversion element, can be formed so as to have performance equivalent to bulk ceramics, by a simple manufacturing process. Furthermore, by removing etching from the back side for forming a pressure liquid chamber in a subsequent step and joining nozzle plates having nozzle holes, the plural liquid discharge heads can be formed collectively. Meanwhile, in FIG. 13, illustration of a liquid supply unit, a flow path and fluid resistance is omitted.

By using the electromechanical conversion element prepared in any one of the first to sixth examples, a liquid discharge head having a configuration as shown in FIG. 13 is prepared, and discharge of ink is evaluated. In this evaluation, ink whose viscosity is adjusted to 5 cp is used, an applied voltage of −10 to −30 V according to the simple Push waveform is applied, and a discharge state of ink from the nozzle hole is verified. As a result, good discharge of ink from all of the nozzle holes is confirmed in any of the first to sixth examples.

Next, an ink jet recording apparatus, as an image forming apparatus (liquid drop discharge apparatus) in which the liquid drop discharge head according to the present embodiments is installed, will be explained.

Figure 14:
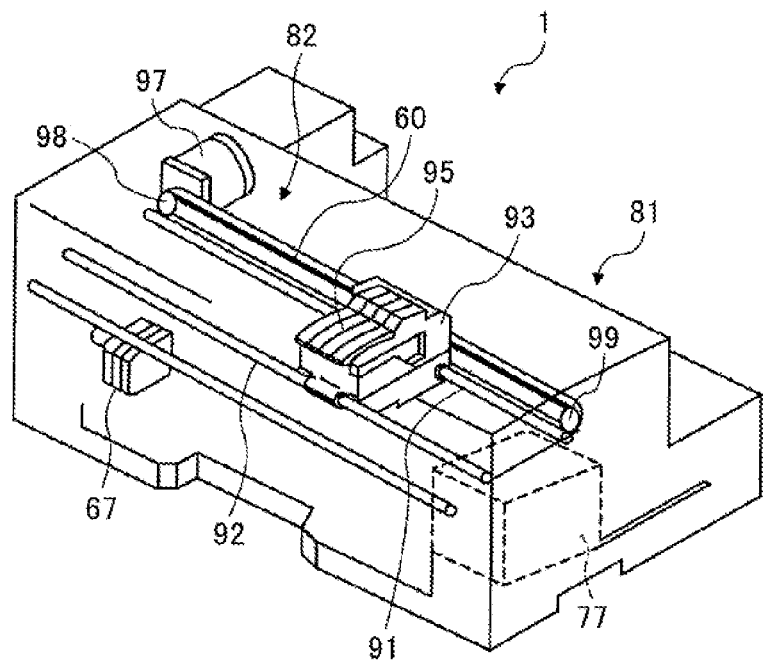
FIG. 14 is a perspective view illustrating an example of an ink jet recording apparatus using the liquid drop discharge head according to the present embodiment.
Figure 15:
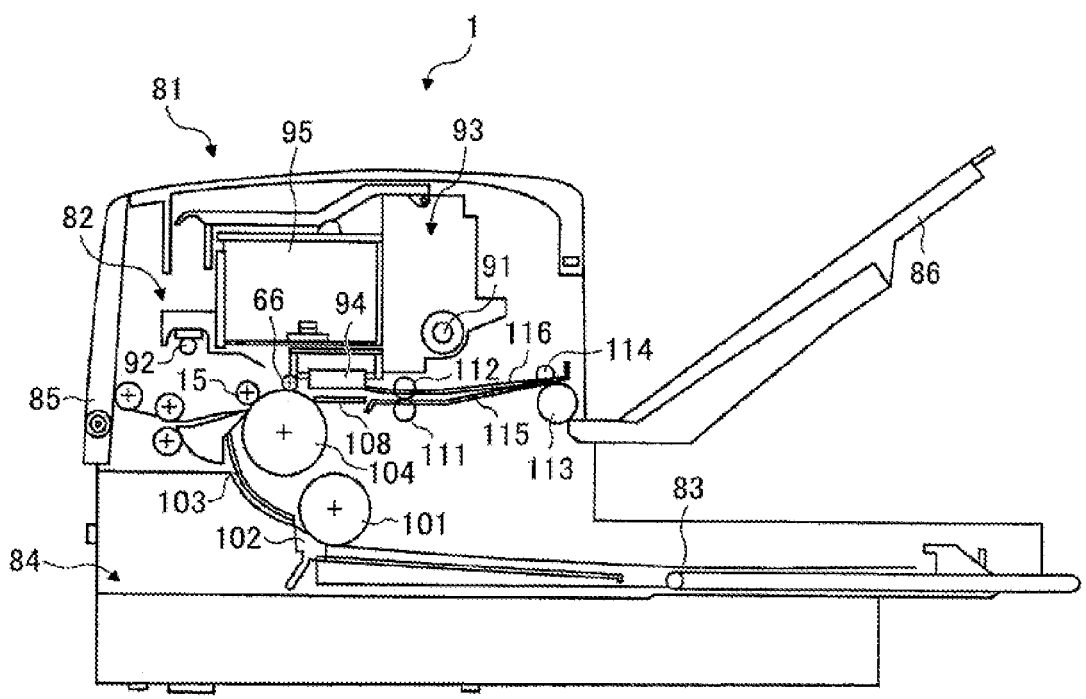
FIG. 15 is a diagram for explaining a mechanical section of the ink jet recording apparatus according to the present embodiment viewed from a side surface.

FIG. 14 is a perspective view illustrating an example of the ink jet recording apparatus according to the present embodiment, and FIG. 15 is a diagram for explaining a mechanical section of the ink jet recording apparatus viewed from a side surface. The ink jet recording apparatus contains a print mechanism unit 82 and the like inside a recording apparatus main body 81. The print mechanism unit 82 includes a carriage 93 movable in a main scanning direction, an ink cartridge 95 as a liquid cartridge for supplying ink, which is liquid for forming an image, to a liquid discharge head 94 installed in the carriage 93, and the like. Moreover, in a lower part of the apparatus main body 81, a paper feeding cassette 84 (or may be a paper feeding tray), which can carry numerous sheets of paper 83 as recording media, can be attached from a front side so as to be insertable and extractable. Moreover, a manual feed tray 85 for manually feeding paper 83 can be set by opening. Then, the ink jet recording apparatus transports the paper 83 fed from the paper feeding cassette 84 or the manual feed tray 85, records a predetermined image on it by the print mechanism unit 82, and afterwards ejects it to a paper ejection tray 86 which is attached on a rear side.

The print mechanism unit 82 holds the carriage 93 slidably in the main scanning direction by a main guide rod 91 and a sub guide rod 92 which are guide members bridged laterally to right and left side plates (not shown). Plural liquid drop discharge heads 94 are attached to the carriage 93 so that nozzles as plural ink discharge ports are arranged in a direction intersecting with the main scanning direction and the liquid drop discharge direction is aimed downward. The plural liquid drop discharge heads 94 are heads (ink jet heads) for discharging liquid drops of respective colors of yellow (Y), cyan (C), magenta (M) and black (Bk). Moreover, ink cartridges 95 for supplying liquid (ink) of respective colors to the liquid drop discharge heads 94 are attached exchangeably to the carriage 93.

The ink cartridge 95 has an atmosphere port in communication with the atmosphere upwardly, a supply port for supplying ink to the ink jet head downwardly, and a porous body filled with ink inside. By a capillary force of the porous body, the liquid (ink) to be supplied to the liquid drop discharge head 94 is maintained at a slightly negative pressure. Moreover, in the present embodiment, four liquid drop discharge heads 94 corresponding to the respective colors are used, but one liquid drop discharge head having plural nozzles for discharging liquid drops of respective colors may be used.

Here, the carriage 93 is slidably engaged with the main guide rod 91 on the rear side (downstream side in the paper conveyance direction), and is slidably placed on the sub guide rod 92 on the front side (upstream side in the paper conveyance direction). Then, a timing belt 100 is stretched between a driving pulley 98 rotationally driven by a main scanning motor 97 and a driven pulley 99 in order to perform moving scan for the carriage 93 in the main scanning direction. The timing belt 100 is fixed to the carriage 93, and the carriage 93 is driven reciprocatingly by forward and backward rotation of the main scanning motor 97.

On the other hand, in order to convey paper 83 set in the paper feeding cassette 84 to the downward side of the head 94, the ink jet recording apparatus according to the present embodiment is provided with a paper feeding roller 101, a friction pad 102, a guide member 103, a conveyance roller 104 and a tip end roller 106. The paper feeding roller 101 and the friction pad 102 separate and feed paper 83 from the paper feeding cassette 84, and the guide member 103 guides the paper 83. Moreover, conveyance roller 104 causes the paper 83 to reverse and conveys it. The tip end roller 106 defines an advancing angle of the paper 83 from a conveyance roller 104 pressed against a periphery of the conveyance roller 104 and from the conveyance roller 104. The conveyance roller 104 is rotationally driven by a sub scanning motor 107 via a gear train.

Then, the ink jet recording apparatus according to the present embodiment is provided with a print receiving member 108 which is a paper guide member for guiding the paper 83 sent from the conveyance roller 104 corresponding to a region where the carriage 93 moves in the main scanning direction on the downward side of the liquid drop discharge head 94. On the downstream side in the paper conveyance direction of the print receiving member 108, a conveyance roller 111 rotationally driven for sending the paper 83 in a paper ejection direction, and a spur 112 are arranged. Furthermore, a paper ejection roller 113 and a spur 114 for sending the paper 83 to the paper ejection tray 86, and guide members 115, 116 for forming a paper ejection path are arranged.

Upon recording, by driving the liquid drop discharge head 94 in response to an image signal while moving the carriage 93, ink is discharged on the stopped paper 83 to record one line, and after conveying the paper 83 by a predetermined amount, a next line is recorded. By receiving a record end signal or a signal indicating that a rear end of the paper 83 arrives at a recording region, a recording operation ends and the paper 83 is ejected.

Moreover, at a position outside the recording region on a right side in the direction of motion of the carriage 93, a recovery device 77 for recovering from a discharge failure of the liquid drop discharge head 94 is arranged. The recovery device 77 includes a capping unit, a suction unit and a cleaning unit. During a printing standby state, the carriage 93 is moved to a side of the recovery device 77, the liquid drop discharge head 94 is capped by the capping unit, the nozzle which is a discharge port is kept in a wet condition, and thereby a discharge failure due to ink drying is prevented. Moreover, by discharging ink irrelevant to recording in the middle of the printing or the like, ink viscosity in all of the discharge ports is kept constant and stable discharge performance is maintained.

In a case where a discharge failure occurs or the like, the discharge port (nozzle) of the head 94 is sealed by the capping unit, and air bubbles or the like along with ink are suctioned out from the discharge port by the suction unit through a tube. Then, ink, dust or the like adhered to a discharge port surface is removed by the cleaning unit, and it recovers from the discharge failure. Moreover, the suctioned ink is ejected to a waste ink reservoir (not shown) arranged in the lower part of the main body, and is absorbed and held by an ink absorber inside the waste ink reservoir.

In this way, in the ink jet recording apparatus, the liquid drop discharge head prepared in any of the above-described embodiment of the present invention and the first to sixth examples is installed. Therefore, the ink jet recording apparatus is free from a discharge failure of ink droplets due to a driving failure of a vibration plate, a stable ink droplet discharge characteristic is obtained, and thereby image quality enhances.

In the present embodiment, it is stated that for a crystal structure of a PZT film preferentially oriented with a {100} plane, a diffraction intensity curve obtained by measurement by rocking curve method on a {200} plane is exemplified, in a case where a shape of a peak has the above-described feature, a strain displacement of an electromechanical conversion element can be increased. However, the above statement is not limited to the above example. For a crystal structure of an electromechanical conversion film having a perovskite crystal structure preferentially oriented with a {n00} plane (n is some positive integer), in a case where a shape of a peak of diffraction intensity obtained by measurement by a rocking curve method on a {N00} plane (N is some positive integer) parallel to the {n00} plane has the above-described feature, a strain displacement of an electromechanical conversion element can be increased.

Furthermore, in the present embodiment, for a PZT film preferentially oriented with a {100} plane, at a position where diffraction intensity of a peak of diffraction intensity corresponding to a {100} plane, among peaks of diffraction intensity obtained by measurement by the θ-2θ method, becomes the maximum (2θ), measurement by changing a tilt angle is performed. A diffraction intensity curve obtained by the above-described measurement is exemplified, and it is stated that in a case where a shape of the peak has the above-described feature, a strain displacement of an electromechanical conversion element can be increased. However, the above statement is not limited to the above example. That is, for an electromechanical conversion film having a perovskite crystal structure preferentially oriented with a {n00} plane (n is some positive integer), at a position where diffraction intensity of a peak of diffraction intensity corresponding to a {N00} plane (N is some positive integer) parallel to the {n00} plane of this film becomes the maximum (2q), in a case where a shape of a peak of diffraction intensity obtained by measurement by changing a tilt angle has the above-described feature, a strain displacement of an electromechanical conversion element can be increased.

The embodiment is an example by which particular effects can be achieved for the following aspects, respectively.

(Aspect A)

In an electromechanical conversion element provided with a lower electrode such as a first electrode 405 formed directly or indirectly on a substrate or a base film; an electromechanical conversion film formed on the lower electrode and including a piezoelectric body having a perovskite crystal structure such as a PZT film 406 preferentially oriented with a {n00} plane where n is some positive integer; and an upper electrode formed on the electromechanical conversion film such as a second electrode 407, for the electromechanical conversion film, a shape of a peak of diffraction intensity obtained by performing measurement by rocking curve method of X-ray diffraction on a {N00} plane where N is some positive integer is a shape which is asymmetric and has two or more bending points.

In a case where a difference occurs between degrees of unevenness on layer surfaces in an upper part and a lower part of the electromechanical conversion film, a shape of a peak of the diffraction intensity being asymmetric and having two or more bending points is obtained. On the other hand, in a case where a difference does not occur between degrees of unevenness on layer surfaces in the upper part and the lower part of the electromechanical conversion film, the shape being asymmetric and having two or more bending points is not obtained. Therefore, in the case where the shape of the peak of the diffraction intensity is asymmetric and has two or more bending points, it is considered that a difference occurs between the degrees of unevenness of layer surfaces in the upper part and the lower part of the electromechanical conversion film. In the case where the difference occurs between the degrees of unevenness on layer surfaces in the upper part and the lower part of the electromechanical conversion film, a tiny distortion occurs in a crystal structure of the electromechanical conversion film. It is empirically known that when this distortion occurs an effect of domain rotation is enhanced in the electromechanical conversion film. By the effect of domain rotation being enhanced, a strain displacement of the electromechanical conversion element using the electromechanical conversion film can be increased.

(Aspect B)

In an electromechanical conversion element provided with a lower electrode such as a first electrode 405 formed directly or indirectly on a substrate or a base film; an electromechanical conversion film formed on the lower electrode and including a piezoelectric body having a perovskite crystal structure such as a PZT film 406 preferentially oriented with a {100} plane; and an upper electrode formed on the electromechanical conversion film such as a second electrode 407, for the electromechanical conversion film, a shape of a peak of diffraction intensity obtained by performing measurement by rocking curve method of X-ray diffraction on a {200} plane is a shape which is asymmetric and has two or more bending points, and in a case where the diffraction intensity at the bending point whose diffraction intensity is greater out of the two bending points is $I\{200\}\_max$, and the diffraction intensity at the another point is $I\{200\}\_2nd$, a value of $I\{200\}\_2nd/I\{200\}\_max$ is greater than or equal to 0.5 but less than or equal to 0.99.

In a case where $I\{200\}\_2nd/I\{200\}\_max$ is less than the lower limit (0.5) as defined above, a distortion of the crystal structure of the electromechanical conversion film occurs locally. In the case where the distortion of the crystal structure occurs, the strain displacement of the electromechanical conversion element using the electromechanical conversion film increases locally due to the effect of domain rotation. Then, in a case of driving continuously the electromechanical conversion element as a piezoelectric actuator, a defect such as a crack is likely to occur in the electromechanical conversion film. In a case where such defect occurs by the continuous driving, a strain displacement after driving decreases from the initial strain displacement. Moreover, in a case where $I\{200\}\_2nd/I\{200\}\_max$ is greater than the upper limit (0.99) defined as above, the effect of the domain rotation becomes smaller, and a sufficient initial strain displacement in the electromechanical conversion element cannot be obtained. By causing $I\{200\}\_2nd/I\{200\}\_max$ to fall within the above-described range, the initial strain displacement of the electromechanical conversion element can be made sufficiently great and a drastic decrease in the strain displacement even after a continuous driving can be prevented.

(Aspect C)

In Aspect B, for the electromechanical conversion film, in a case where an angle between a sample substrate surface and the incident X-ray at the bending point whose diffraction intensity is greater out of the bending points is denoted by $\omega\_max$, and an angle between the sample substrate surface and the incident X-ray at the another point is denoted by $\omega\_2nd$, $|\omega\_max-\omega\_2nd|$ is greater than or equal to 2° but less than or equal to 20°, and is more preferably greater than or equal to 5° but less than or equal to 15°. In a case where $|\omega\_max-\omega\_2nd|$ is less than the lower limit defined as described above (2°), since the distortion of the crystal structure of the PZT film becomes smaller, the effect of the domain rotation becomes smaller, and a sufficient strain displacement in the electromechanical conversion element cannot be obtained. In a case where $|\omega\_max-\omega\_2nd|$ is greater than the upper limit defined as described above (20°), since the distortion of the crystal structure of the electromechanical conversion film becomes greater, the strain displacement by the domain rotation can be increased. However, in a case where the distortion of the crystal structure of the electromechanical conversion film becomes quite great, a defect such as a crack is likely to occur in the electromechanical conversion film, and in the case of continuously driving the electromechanical conversion element as the piezoelectric actuator, a strain displacement after driving decreases from the initial strain displacement. By causing $|\omega\_max-\omega\_2nd|$ to fall within the above-described range, the initial strain displacement of the electromechanical conversion element can be made sufficiently great and a drastic decrease in the strain displacement even after a continuous driving can be prevented.

(Aspect D)

In an electromechanical conversion element provided with a lower electrode such as a first electrode 405 formed directly or indirectly on a substrate or a base film; an electromechanical conversion film formed on the lower electrode and including a piezoelectric body having a perovskite crystal structure such as a PZT film 406; and an upper electrode formed on the electromechanical conversion film such as a second electrode 406, for the electromechanical conversion film, a shape of a peak of diffraction intensity obtained by performing measurement by rocking curve method of X-ray diffraction on a {200} plane is a shape which is asymmetric and has two or more local maximum points.

For the electromechanical conversion film in which the shape of the peak of diffraction intensity is asymmetric and has two or more local maximum points, a difference occurs between degrees of unevenness of layer surfaces in an upper part and a lower part of the electromechanical conversion film. In the case where the difference occurs between the degrees of unevenness on layer surfaces in the upper part and the lower part of the electromechanical conversion film, a tiny distortion occurs in a crystal structure of the electromechanical conversion film. When this distortion occurs, an effect of domain rotation is enhanced can be enhanced in the electromechanical conversion film. By enhancing the effect of the domain rotation, a strain displacement of the electromechanical conversion element using the electromechanical conversion film can be increased.

(Aspect E)

In Aspect D, in a case where for the electromechanical conversion film, the shape has two local maximum points, and for the electromechanical conversion film, the diffraction intensity at the local maximum point whose diffraction intensity is greater out of the two local maximum points is I{200}_max_2, and the diffraction intensity at the another point is I{200}_2nd_2, I{200}_2nd_2/I{200}_max_2 is greater than or equal to 0.5 but less than or equal to 0.99.

In a case where I{200}_2nd_2/I{200}_max_2 is less than the lower limit defined as described above (0.5), a distortion of a crystal structure of the electromechanical conversion film occurs locally. In a case where a distortion of a crystal structure occurs locally, a strain displacement of the electromechanical conversion element using the electromechanical conversion film increases locally according to an effect of a domain rotation. Then, in a case of driving continuously the electromechanical conversion element as a piezoelectric actuator, a defect such as a crack is likely to occur in the electromechanical conversion film. In a case where such defect occurs by the continuous driving, a strain displacement after driving decreases from the initial strain displacement. Moreover, in a case where I{200}_2nd_2/I{200}_max_2 is greater than the upper limit defined as described above (0.99), the effect of the domain rotation becomes smaller, and a sufficient initial strain displacement in the electromechanical conversion element cannot be obtained. By causing I{200}_2nd_2/I{200}_max_2 to fall within the above-described range, the initial strain displacement of the electromechanical conversion element can be made sufficiently great and a drastic decrease in the strain displacement even after a continuous driving can be prevented.

(Aspect F)

In aspect E, for the electromechanical conversion film, in a case where the diffraction intensity at the local minimum point between the two local maximum points is I{200}_min_2, I{200}_min_2/I{200}_max_2 is greater than or equal to 0.3.

In a case where I{200}_min_2/I{200}_max_2 is less than the lower limit defined as described above (0.3), a distortion of a crystal structure of the electromechanical conversion film occurs locally. In a case where a distortion of a crystal structure occurs locally, a strain displacement of the electromechanical conversion element using the electromechanical conversion film increases locally according to an effect of a domain rotation. Then, in a case of driving continuously the electromechanical conversion element as a piezoelectric actuator, a defect such as a crack is likely to occur in the electromechanical conversion film. In a case where such defect occurs by the continuous driving, a strain displacement after driving decreases from the initial strain displacement. By causing I{200}_min_2/I{200}_max_2 to fall within the above-described range, a drastic decrease in the strain displacement even after a continuous driving can be prevented.

(Aspect G)

In aspect E or F, for the electromechanical conversion film, in a case where an angle between the sample substrate surface and the incident X-ray at the local maximum point whose diffraction intensity is greater out of the two local maximum points is ω_max_2, and an angle between the sample substrate surface and the incident X-ray at the another point is ω2nd_2, |ω_max_2−ω2nd_2| is greater than or equal to 2° but less than or equal to 20°. In a case where |ω_max_2−ω2nd_2| is less than the lower limit defined as described above (2°), the distortion of the crystal structure of the electromechanical conversion film becomes smaller. Then, the effect of the domain rotation becomes smaller, and a sufficient strain displacement in the electromechanical conversion element cannot be obtained. Moreover, in a case where |ω_max_2−ω2nd_2| are greater than the upper limits defined as described above (20°), since the distortion of the crystal structure of the electromechanical conversion film becomes greater, the strain displacement by the domain rotation can be increased. However, in a case where the distortion of the crystal structure of the electromechanical conversion film becomes quite great, a defect such as a crack is likely to occur in the electromechanical conversion film. In the case of continuously driving the electromechanical conversion element as the piezoelectric actuator, a strain displacement after driving decreases from the initial strain displacement. By causing |ω_max_2−ω_2nd_2| to fall within the above-described range, the initial strain displacement of the electromechanical conversion element can be made sufficiently great and a drastic decrease in the strain displacement even after a continuous driving can be prevented.

(Aspect H)

In any one of aspects B to G, for the electromechanical conversion film, a half maximum full width (FWHM) of a peak of diffraction intensity obtained by performing measurement of X-ray diffraction by rocking curve method on a {200} plane is greater than or equal to 6° but less than or equal to 16°. In a case where the FWHM is less than the lower limit (6°), since the distortion of the crystal structure of the PZT film becomes smaller, the effect of the domain rotation decreases, and a sufficient strain displacement in the electromechanical conversion element cannot be obtained. Moreover, in a case where the FWHM is greater than the upper limit) (16°), since the distortion of the crystal structure of the electromechanical conversion film becomes considerably greater, an initial strain displacement of the electromechanical conversion element becomes quite great according to the effect of the domain rotation. However, in the case of continuously driving the electromechanical conversion element as the piezoelectric actuator, when the distortion of the crystal structure of the electromechanical conversion film is quite great, a defect such as a crack is likely to occur, and for the electromechanical conversion element a strain displacement after driving decreases from the initial strain displacement. By causing the FWHM to fall within the above-described range, the initial strain displacement of the electromechanical conversion element can be made sufficiently great and a drastic decrease in the strain displacement even after a continuous driving can be prevented.

(Aspect I)

In any one of aspects A to H, the crystal structure of the electromechanical conversion film includes a tetragonal a-domain and a tetragonal c-domain in a vicinity adjacent to the lower electrode, and includes a tetragonal a-domain, a tetragonal c-domain, and any one of rhombohedral, orthorhombic and quasi-cubic in a vicinity of the upper electrode.

In a case where the crystal structures of the electromechanical conversion film in the vicinity of the lower electrode and of the vicinity of the upper electrode are as above, a great difference occurs between degrees of unevenness of layer surfaces in an upper part and a lower part of the electromechanical conversion film, and a distortion occurs in a crystal structure of the electromechanical conversion film. It is empirically known that when a distortion occurs in a crystal structure, a strain according to an effect of domain rotation is increased in the electromechanical conversion film. Then, a strain displacement of the electromechanical conversion film can be increased.

(Aspect J)

In any one of aspects A to I, the electromechanical conversion film includes lead zirconate titanate (PZT), and a composition ratio of titanium (Ti) for zirconium (Zr) (Ti/(Zr+Ti)) in the electromechanical conversion film is greater than or equal to 0.45 but less than or equal to 0.55.

In a case where the composition ratio of Zr and Ti is less than the above-described lower limit (0.45), since an effect of domain rotation, which will be described later, becomes insufficient, strain displacement of the electromechanical conversion element cannot be ensured sufficiently. Moreover, in a case where the composition ratio of Zr and Ti is greater than the above-described upper limit (0.55), since a piezoelectric effect becomes insufficient, the strain displacement of the electromechanical conversion element also cannot be ensured sufficiently. By causing the composition ratio of Zr and Ti to fall within the above-described range, the initial strain displacement of the electromechanical conversion element can be made sufficiently great.

(Aspect K)

In a liquid drop discharge head provided with a nozzle for discharging liquid drops, a pressure chamber in communication with the nozzle, and a pressure generation means of generating pressure for liquid in the pressure chamber, the electromechanical conversion element in any one of aspects A to J is provided as the pressure generation means.

(Aspect L)

In an electromechanical conversion element provided with a lower electrode such as a first electrode 405 formed directly or indirectly on a substrate or a base film; an electromechanical conversion film formed on the lower electrode and including a piezoelectric body having a perovskite crystal structure such as a PZT film 406 preferentially oriented with a {n00} plane where n is some positive integer; and an upper electrode formed on the electromechanical conversion film such as a second electrode 407, for the electromechanical conversion film, a shape of a peak of diffraction intensity obtained by performing measurement by changing a tilt angle ($\chi$) within a range of ±15° at a position (2θ) where diffraction intensity becomes the maximum in a peak of diffraction intensity corresponding to a {N00} plane where N is some positive integer, among peaks of diffraction intensity obtained by measurement of θ-2θ method of X-ray diffraction, is a shape which has two or more bending points.

In a case where an inclination of a crystal plane with respect to the substrate surface of the electromechanical conversion film is great, a form of a peak of the diffraction intensity which is a form having two or more bending points is obtained. On the contrary, in a case where the inclination of a crystal plane with respect to the substrate surface of the electromechanical conversion film is small, the form of the peak of the diffraction intensity which is a form having two or mode bending points is not obtained. Therefore, in the electromechanical conversion film, in which the form of the peak of the diffraction intensity has two or more bending points, the inclination of a crystal plane with respect to the substrate surface of the electromechanical conversion film is considered to be great. In a case where the inclination of the crystal plane with respect to the substrate surface of the electromechanical conversion film increases, tiny distortion occurs in the crystal structure of the electromechanical conversion film. It is empirically known that in a case where such distortion occurs, in the electromechanical conversion film the effect or domain rotation is enhanced. According to the enhancement of the effect of domain rotation, the strain displacement of an electromechanical conversion element using the electromechanical conversion film can be increased.

(Aspect M)

In an electromechanical conversion element provided with a lower electrode such as a first electrode 405 formed directly or indirectly on a substrate or a base film; an electromechanical conversion film formed on the lower electrode and including a piezoelectric body having a perovskite crystal structure such as a PZT film 406 preferentially oriented with a {100} plane; and an upper electrode formed on the electromechanical conversion film such as a second electrode 407, for the electromechanical conversion film, a shape of a peak of diffraction intensity obtained upon changing a tilt angle ($\chi$) within a range of ±15° at a position (2θ) where diffraction intensity becomes the maximum in a peak of diffraction intensity corresponding to a {100} plane, in measurement by θ-2θ method of X-ray diffraction, is a shape which has two bending points, in a case where a position of a point whose diffraction intensity is greater out of the bending points is $\chi\_max$, and a position of another point is $\chi\_2nd$, $|\chi\_max-\chi\_2nd|$ is greater than or equal to 2° but less than or equal to 10°.

In a case where $|\chi\_max-\chi\_2nd|$ is less than the lower limit defined as described above (2°), the distortion of the crystal structure of the electromechanical conversion film becomes small. Then, the effect of the domain rotation becomes small, and a sufficient strain displacement in the electromechanical conversion element cannot be obtained. Moreover, in a case where $|\chi\_max\ \chi\_2nd|$ is greater than the upper limit defined as described above (10°), the distortion of the crystal structure of the electromechanical conversion film becomes great, and the strain displacement by the domain rotation can be increased. However, in a case where the distortion of the crystal structure of the electromechanical conversion film becomes considerably great, a defect such as a crack is likely to occur in the electromechanical conversion film, a strain displacement after driving decreases from the initial strain displacement. By causing $|\chi\_max-\chi\_2nd|$ to fall within the above-described range, the initial strain displacement of the electromechanical conversion element can be made sufficiently great and a drastic decrease in the strain displacement even after a continuous driving can be prevented.

(Aspect N)

In an electromechanical conversion element provided with a lower electrode such as a first electrode 405 formed directly or indirectly on a substrate or a base film; an electromechanical conversion film formed on the lower electrode and including a piezoelectric body having a perovskite crystal structure such as a PZT film 406; and an upper electrode formed on the electromechanical conversion film such as a second electrode 407, for the electromechanical conversion film, a shape of a peak of diffraction intensity obtained upon changing a tilt angle ($\chi$) within a range of ±15° at a position (2θ) where diffraction intensity becomes the maximum in a peak of diffraction intensity corresponding to a {100} plane, in measurement by θ-2θ method of X-ray diffraction, is a shape which has two or more local maximum points.

In the electromechanical conversion film, in which the form of the peak of the diffraction intensity has two or more local maximum points, the inclination of a crystal plane with respect to the substrate surface of the electromechanical conversion film is considered to be great. In a case where the inclination of the crystal plane with respect to the substrate surface of the electromechanical conversion film increases, tiny distortion occurs in the crystal structure of the electromechanical conversion film. It is empirically known that in a case where such distortion occurs, in the electromechanical conversion film the effect or domain rotation is enhanced. According to the enhancement of the effect of domain rotation, the strain displacement of an electromechanical conversion element using the electromechanical conversion film can be increased.

(Aspect O)

In aspect N, in a case where for the electromechanical conversion film, the shape has two local maximum points, and in a case where a tilt angle at a position whose diffraction intensity is greater out of the two local maximum points is $\chi\_max\_2$, and a tilt angle at another point is $\chi\_2nd\_2$, $|\chi\_max\_2-\chi\_2nd\_2|$ is greater than or equal to 2° but less than or equal to 8°.

In a case where $|\chi\_max\_2-\chi\_2nd\_2|$ is less than the lower limit defined as described above (2°), the distortion of the crystal structure of the electromechanical conversion film becomes small. Then, the effect of the domain rotation becomes small, and a sufficient strain displacement in the electromechanical conversion element cannot be obtained. Moreover, in a case where $|\chi\_max\_2-\chi\_2nd\_2|$ is greater than the upper limit defined as described above (20°), the distortion of the crystal structure of the electromechanical conversion film becomes great, and the strain displacement by the domain rotation can be increased. However, in the case where the distortion of the crystal structure becomes considerably great, a defect such as a crack is likely to occur in the electromechanical conversion film, and in the case of continuously driving the electromechanical conversion element as the piezoelectric actuator, a strain displacement after driving decreases from the initial strain displacement. By causing $|\chi\_max\_2-\chi\_2nd\_2|$ to fall within the above-described range, the initial strain displacement of the electromechanical conversion element can be made sufficiently great and a drastic decrease in the strain displacement even after a continuous driving can be prevented.

(Aspect P)

In aspect O, for the electromechanical conversion film, in a case where the diffraction intensity at the local maximum point whose diffraction intensity is greater out of the two local maximum points is $I\{100\}\_max\_2$, and the diffraction intensity at the local minimum point between the two local maximum points is $I\{100\}\_min\_2$, $I\{100\}\_min\_2/I\{100\}\_max\_2$ is greater than or equal to 0.5.

In a case where $I\{100\}\_min\_2/I\{100\}\_max\_2$ is less than the lower limit defined as described above (0.5), a distortion of the crystal structure of the electromechanical conversion film occurs locally. In the case where a distortion of a crystal lattice occurs locally, a strain displacement of the electromechanical conversion element using the electromechanical conversion film increases locally according to an effect of domain rotation. Then, in a case of driving continuously the electromechanical conversion element as a piezoelectric actuator, a defect such as a crack is likely to occur in the electromechanical conversion film. In a case where such defect occurs by the continuous driving, a strain displacement after driving decreases from the initial strain displacement. By causing $I\{100\}\_min\_2/I\{100\}\_max\_2$ to fall within the above-described range, a drastic decrease in the strain displacement even after a continuous driving can be prevented.

(Aspect Q)

In any one of aspects M to P, for the electromechanical conversion film, a half maximum full-width (FWHM) of a peak of diffraction intensity obtained upon changing the tilt angle ($\chi$) within a range of ±15° is greater than or equal to 6° but less than or equal to 16°.

In a case where the FWHM is less than the lower limit (6°), since the distortion of the crystal structure of the PZT film becomes small, the effect of the 90° domain rotation decreases, and a sufficient strain displacement in the electromechanical conversion element cannot be obtained. Moreover, in a case where the FWHM is greater than the upper limit) (16°, since the distortion of the crystal structure of the electromechanical conversion film becomes considerably great, an initial strain displacement of the electromechanical conversion film by the effect of domain rotation can be increased considerably. However, in the case of continuously driving the electromechanical conversion element as the piezoelectric actuator, when a distortion of a crystal structure of the electromechanical conversion element is quite great, a defect such as a crack is likely to occur in the electromechanical conversion film, and in the electromechanical conversion element a strain displacement after driving decreases from the initial strain displacement. By causing the FWHM to fall within the above-described range, the initial strain displacement of the electromechanical conversion element can be made sufficiently great and a drastic decrease in the strain displacement even after a continuous driving can be prevented.

(Aspect R)

In any one of aspects L to Q, the electromechanical conversion film includes lead zirconate titanate (PZT), and a composition ratio of titanium (Ti) for zirconium (Zr) (Ti/(Zr+Ti)) in the electromechanical conversion film is greater than or equal to 0.45 but less than or equal to 0.55.

In a case where the composition ratio of Zr and Ti is less than the above-described lower limit (0.45), since an effect of domain rotation, which will be described later, becomes insufficient, strain displacement of the electromechanical conversion element cannot be ensured sufficiently. Moreover, in a case where the composition ratio of Zr and Ti is greater than the above-described upper limit (0.55), since a piezoelectric effect becomes insufficient, the strain displacement of the electromechanical conversion element also cannot be ensured sufficiently. By causing the composition ratio of Zr and Ti to fall within the above-described range, the initial strain displacement of the electromechanical conversion element can be made sufficiently great.

(Aspect S)

In a liquid drop discharge head provided with a nozzle for discharging liquid drops, a pressure chamber in communication with the nozzle, and a pressure generation means of generating pressure for liquid in the pressure chamber, the electromechanical conversion element in any one of aspects L to R is provided as the pressure generation means.

(Aspect T)

An image forming apparatus is provided with the liquid drop discharge head in aspect S.

Further, the present invention is not limited to these embodiments, but various variations and modifications may be made without departing from the scope of the present invention.

The present application is based on and claims the benefit of priority of Japanese Priority Applications No. 2014-203311 filed on Oct. 1, 2014 and No. 2014-203399 filed on Oct. 1, 2014, the entire contents of which are hereby incorporated by reference.

What is claimed is:

1. An electromechanical conversion element comprising:
   a lower electrode formed directly or indirectly on a substrate or a base film;
   an electromechanical conversion film formed on the lower electrode and including a piezoelectric body having a perovskite crystal structure preferentially oriented with a {n00} plane where n is a positive integer; and
   an upper electrode formed on the electromechanical conversion film, wherein a diffraction peak at a position $2\theta$ at which a diffraction intensity has a maximum value and which corresponds to a (X00) plane or a (00X) plane, X being 1 or 2, obtained by a $\theta$-$2\theta$ measurement in an X-ray diffraction measurement, shows a trapezoidal peak shape and has two or more bending points.

2. The electromechanical conversion element as claimed in claim 1, wherein the diffraction peak is obtained in measurement by an X-ray rocking curve method in a case where X is 2.

3. The electromechanical conversion element as claimed in claim 1, wherein the diffraction peak is obtained by changing a tilt angle ($\chi$) within a range of $\chi$ from $-15°$ to $+15°$ in a case where X is 1.

4. The electromechanical conversion element as claimed in claim 1, wherein two or more diffraction intensity peaks are superimposed to form the diffraction peak, so that the diffraction peak has two or more inflection points.

5. The electromechanical conversion element as claimed in claim 1, wherein a degree of orientation of a plane orientation (100) is greater than or equal to 0.75, the degree of orientation of a plane orientation (hkl), where each of h, k and l is zero or a positive integer, $\rho$(hkl), being obtained based on a ratio of peak intensities for respective plane orientations (hkl), according to a formula $$\rho(hkl)=I(hkl)/\Sigma I(hkl),$$

the peak intensity I(hkl) being obtained by integrating diffraction intensity obtained by the $\theta$-$2\theta$ measurement in the X-ray diffraction measurement in a peak at a position $2\theta$ at which the diffraction intensity has a maximum value and which corresponds to a (hkl) plane, $\Sigma I$(hkl) being a sum of the peak intensities.

6. The electromechanical conversion element as claimed in claim 1, wherein a digging process is performed on a back side of the substrate by etching or the like, in the electromechanical conversion film in an unconstrained state in a portion where the digging process is performed, the position $2\theta$ of the diffraction peak, which corresponds to the (200) plane obtained by the $\theta$-$2\theta$ measurement in the X-ray diffraction measurement, is greater than or equal to $44.45°$ but less than or equal to $44.75°$, and a shape of the diffraction peak corresponding to the (200) plane or a diffraction peak corresponding to a (400) plane is not symmetric with respect to a line passing through the position $2\theta$ of the diffraction peak and perpendicular to the $2\theta$-axis.

7. The electromechanical conversion element as claimed in claim 6, wherein in the electromechanical conversion film in a case of performing peak separation for the diffraction peak corresponding to the (200) plane or the (400) plane, two of the separated peaks belong to a tetragonal a-domain structure and a tetragonal c-domain structure, respectively.

8. The electromechanical conversion element as claimed in claim 1, wherein the electromechanical conversion film includes lead zirconate titanate (PZT), and a composition ratio of zirconium (Zr) and titanium (Ti) in the electromechanical conversion film, Ti/(Zr+Ti), is greater than or equal to 45% but less than or equal to 55%.

9. A liquid drop discharge head comprising:
   a nozzle configured to discharge liquid drops;
   a pressure chamber in communication with the nozzle; and
   a discharge drive unit configured to control a pressure of liquid in the pressure chamber, wherein a part of a wall surface of the pressure liquid chamber includes a vibration plate, and the electromechanical conversion element as claimed in claim 1 is arranged in the vibration plate.

10. An image forming apparatus comprising the liquid drop discharge head as claimed in claim 9.

* * * * *